(12) United States Patent
Kim et al.

(10) Patent No.: US 10,673,004 B2
(45) Date of Patent: Jun. 2, 2020

(54) ELECTROLUMINESCENT DISPLAY DEVICE

(71) Applicant: SAMSUNG ELECTRONICS CO., LTD., Suwon-si, Gyeonggi-do (KR)

(72) Inventors: Tae Hyung Kim, Seoul (KR); Eun Joo Jang, Suwon-si (KR); Dae Young Chung, Suwon-si (KR); Yong Wook Kim, Yongin-si (KR); Yuho Won, Seoul (KR); Oul Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/297,833

(22) Filed: Mar. 11, 2019

(65) Prior Publication Data
US 2019/0280231 A1 Sep. 12, 2019

(30) Foreign Application Priority Data

Mar. 9, 2018 (KR) .................. 10-2018-0028318

(51) Int. Cl.
*C09K 11/88* (2006.01)
*H01L 51/50* (2006.01)
(Continued)

(52) U.S. Cl.
CPC ............ *H01L 51/502* (2013.01); *C09K 11/02* (2013.01); *C09K 11/883* (2013.01);
(Continued)

(58) Field of Classification Search
CPC .. C09K 11/883; H01L 51/502; H01L 51/5012
See application file for complete search history.

(56) References Cited

U.S. PATENT DOCUMENTS 9,257,600 B2 2/2016 Tang et al.
9,529,136 B2 12/2016 Kim et al.
(Continued)

FOREIGN PATENT DOCUMENTS

CN 105742462 A 7/2016
EP 3187564 A1 7/2017
(Continued)

OTHER PUBLICATIONS

Anikeeva et al., "Electroluminescence from a Mixed Red-Green-Blue Colloidal Quantum Dot Monolayer", Nano Letters, vol. 7, No. 8, 2007, pp. 2196-2200.
(Continued)

*Primary Examiner* — Thomas L Dickey
(74) *Attorney, Agent, or Firm* — Cantor Colburn LLP

(57) ABSTRACT

An electroluminescence display device, including a first electrode and a second electrode facing each other; a quantum dot emission layer disposed between the first electrode and the second electrode, the quantum dot emission layer including a plurality of quantum dots and not including cadmium, wherein the quantum dot emission layer includes a red emission layer disposed in a red pixel, a green emission layer disposed in a green pixel, and a blue emission layer disposed in a blue pixel, wherein the device has color reproducibility according to a DCI standard of greater than or equal to about 89%.

28 Claims, 10 Drawing Sheets
(1 of 10 Drawing Sheet(s) Filed in Color)

(51) Int. Cl.
 *H01L 51/00* (2006.01)
 *H01L 27/32* (2006.01)
 *C09K 11/02* (2006.01)
 *H05B 33/14* (2006.01)

(52) U.S. Cl.
 CPC ...... *H01L 27/3211* (2013.01); *H01L 51/0043* (2013.01); *H01L 51/5036* (2013.01); *H01L 51/5092* (2013.01); *H01L 51/5096* (2013.01); *H05B 33/14* (2013.01); *H01L 51/5056* (2013.01); *H01L 51/5072* (2013.01)

(56) References Cited

U.S. PATENT DOCUMENTS

| | | |
|---|---|---|
| 9,698,311 B2 | 7/2017 | Greco et al. |
| 9,804,436 B2 | 10/2017 | Yokota |
| 2008/0203895 A1* | 8/2008 | Miller .................... H05B 33/10 313/498 |
| 2008/0203899 A1* | 8/2008 | Miller .................. C09K 11/883 313/499 |
| 2009/0278141 A1 | 11/2009 | Coe-Sullivan et al. |
| 2013/0063023 A1 | 3/2013 | Pan et al. |
| 2015/0028305 A1 | 1/2015 | Niu et al. |
| 2016/0004124 A1 | 1/2016 | Benoit et al. |
| 2016/0186960 A1 | 6/2016 | Kim et al. |

FOREIGN PATENT DOCUMENTS

| | | |
|---|---|---|
| JP | 5878579 B2 | 3/2016 |
| JP | 2016167041 A | 9/2016 |
| KR | 101140309 B1 | 4/2012 |
| KR | 1020140056490 A | 5/2014 |
| KR | 1020140121351 A | 10/2014 |
| KR | 1020150116443 A | 10/2015 |
| KR | 101621820 B1 | 5/2016 |

OTHER PUBLICATIONS

Lee et al., "Highly Efficient, Color-Reproducible Full-Color Electroluminescent Devices Based on red/Green/Blue Quantum Dot-Mixed Multilayer", ACS NANO, vol. 09, No. 11. 2015, pp. 10941-10949.

Lim et al., "Highly Efficient Cadmium-Free Quantum Dot Light-Emitting Diodes Enabled by the Direct Formation of Excitons within InP@ZnSeS Quantum Dots", ACS NANO, Acsnano.org, vol. 7, No. 10, 2013, pp. 9019-9026.

Wang et al., "Bright, efficient, and color-stable violet ZnSe-based quantum dot light-emitting diodes*", Nanoscale, 7, 2015, pp. 2951.

Yang et al., "High-efficiency light-emitting devices based on quantum dots with tailored nanostructures", Nature Photonics, vol. 09, 2015, pp. 259-266.

European Search Report for European Patent Application No. 19161982.4 dated Jul. 16, 2019.

* cited by examiner

ELECTROLUMINESCENT DISPLAY DEVICE

CROSS-REFERENCE TO RELATED APPLICATION

This application claims priority to and the benefit of Korean Patent Application No. 10-2018-0028318, filed in the Korean Intellectual Property Office on Mar. 9, 2018, the entire content of which is incorporated herein by reference.

BACKGROUND

1. Field

An electroluminescent display device is disclosed.

2. Description of the Related Art

An electroluminescent display device including quantum dots may be used in a display device. Light emission may be induced by application of a voltage resulting in a radiative recombination of excited charges generated between layers of the device. Nonetheless, there remains a need for an improved electroluminescent material.

SUMMARY

An embodiment provides a quantum dot-based electroluminescent display device including cadmium-free quantum dots and capable of providing improved color reproducibility.

In an embodiment, an electroluminescent display device includes:

a first electrode and a second electrode facing each other; and a quantum dot emission layer disposed between the first electrode and the second electrode, the quantum dot emission layer including a plurality of quantum dots and not including cadmium, wherein the quantum dot emission layer includes a red emission layer disposed in a red pixel, a green emission layer disposed in a green pixel, and a blue emission layer disposed in a blue pixel, wherein the red emission layer includes a plurality of red light emitting quantum dots and the red pixel exhibits an electroluminescence (EL) peak wavelength in a range of about 627 nanometers (nm) to about 640 nm and a full width at half maximum (FWHM) of less than or equal to about 42 nm, wherein the green emission layer includes a plurality of green light emitting quantum dots and the green pixel exhibits a electroluminescence peak wavelength in a range of about 525 nm to about 536 nm and a full width at half maximum (FWHM) of less than or equal to about 39 nm, wherein the blue emission layer includes a plurality of blue light emitting quantum dots and the blue pixel exhibits a electroluminescence peak wavelength in a range of about 440 nm to about 460 nm and a full width at half maximum (FWHM) of less than or equal to about 33 nm, and wherein the device has color reproducibility according to a DCI standard of greater than or equal to about 89 percent (%).

The device may have color reproducibility according to a BT2020 standard of greater than or equal to about 66%.

The device may have color reproducibility according to a DCI standard of greater than or equal to about 94%.

The device may have color reproducibility according to a BT2020 standard of greater than or equal to about 72%.

In the device, the red pixel may exhibit a full width at half maximum (FWHM) of less than or equal to 36 nm.

In the device, the green pixel may exhibit a full width at half maximum (FWHM) of less than or equal to 37 nm.

In the device, the blue pixel may exhibit a full width at half maximum (FWHM) of less than or equal to 30 nm.

At least a part of the red light emitting quantum dots may be a red light emitting semiconductor nanocrystal particle including a core including indium (In), phosphorus (P), and optionally zinc (Zn), and a shell disposed on a surface of the core and including zinc, sulfur, and optionally selenium.

The red light emitting semiconductor nanocrystal particle may have a size of greater than or equal to 5 nm and less than or equal to about 15 nm.

At least a part of the green light emitting quantum dots may be a green light emitting semiconductor nanocrystal particle including a core including indium (In), phosphorus (P), and optionally zinc (Zn) and a shell disposed on a surface of the core and including zinc, sulfur, and optionally selenium.

The green light emitting semiconductor nanocrystal particle may have a size of greater than or equal to 6 nm and less than or equal to about 15 nm.

At least a part of the blue light emitting quantum dots may be a blue light emitting semiconductor nanocrystal particle including zinc, tellurium, and selenium, wherein an amount of the tellurium is less than an amount of the selenium, and the blue light emitting semiconductor nanocrystal particle may include a core including a first semiconductor material including zinc, tellurium, and selenium and a shell including a second semiconductor material that has a different composition from the first semiconductor material and disposed on at least a part of the core.

In the blue light emitting semiconductor nanocrystal particle, a mole ratio of the tellurium relative to the selenium may be less than or equal to about 0.05.

In the blue light emitting semiconductor nanocrystal particle, an amount of the zinc may be greater than an amount of the selenium.

In the blue light emitting semiconductor nanocrystal particle, a mole ratio of the tellurium relative to the zinc may be less than or equal to about 0.03.

The first semiconductor material may include $ZnTe_xSe_{1-x}$, wherein, x is greater than about 0 and less than or equal to about 0.05.

The second semiconductor material may include zinc, selenium, and sulfur.

The blue light emitting semiconductor nanocrystal particle may have a size of greater than or equal to about 8 nm and less than or equal to about 30 nm.

In the device, the red pixel may have peak external quantum efficiency of greater than or equal to about 2%.

In the device, the green pixel may have peak external quantum efficiency of greater than or equal to about 2%.

In the device, the blue pixel may have peak external quantum efficiency of greater than or equal to about 2%.

In the device, the red pixel may have maximum brightness of greater than or equal to about 200 $cd/m^2$.

In the device, the green pixel may have maximum brightness of greater than or equal to about 300 $cd/m^2$.

In the device, the blue pixel may have maximum brightness of greater than or equal to about 300 $cd/m^2$.

The device may include a charge auxiliary layer between the first electrode and the quantum dot emission layer and between the second electrode and the quantum dot emission layer.

In the device, the first electrode may include an anode, and the device may further include a hole injection layer, a hole transport layer, an electron blocking layer, or a combination thereof between the first electrode and the quantum dot emission layer, the second electrode may include a cathode, and the device may further include an electron injection layer, an electron transport layer, a hole blocking layer, or a combination thereof between the second electrode and the quantum dot emission layer.

At least one of the hole injection layer and the hole transport layer may include poly[9,9-dioctylfluorene-co-N-[4-butylphenyl]-di-phenylamine] (TFB), and the TFB may have a weight average molecular weight of greater than or equal to about 50000 Daltons.

At least one of the electron transport layer and the electron injection layer may include ET204:Liq, Liq, ZnO, ZnMgO, or a combination thereof.

The charge auxiliary layer may not include poly-[(9,9-bis (3'-(N,N-dimethylamino)propyl)-2,7-fluorene)-alt-2,7-(9,9-dioctylfluorene)] (PFN).

The charge auxiliary layer may not include a conjugated polyelectrolyte. The charge auxiliary layer may not comprise a conjugated polyelectrolyte for example, having a N,N-dimethylamino)alkyl group.

The electroluminescent display device including environmentally-friendly quantum dots without a heavy metal (e.g., non-cadmium-based quantum dot) may be realized. The device according to an embodiment may have a defined range of maximum emission peak wavelength and a defined range of full width at half maximum (FWHM) by a voltage application, and thereby showing improved color reproducibility.

Also disclosed is a method of manufacturing the electroluminescent display device, the method including providing the red light emitting semiconductor nanocrystal, the green light emitting semiconductor nanocrystal, and the blue light emitting semiconductor nanocrystal; and forming a quantum dot emission layer disposed between a first electrode and a second electrode, the quantum dot emission layer comprising a plurality of quantum dots and not including cadmium, wherein the quantum dot emission layer includes a red emission layer disposed in a red pixel, a green emission layer disposed in a green pixel, and a blue emission layer disposed in a blue pixel, wherein the red emission layer includes a plurality of red light emitting quantum dots, and the red pixel exhibits an electroluminescence peak wavelength in a range of about 627 nanometers to about 640 nanometers and a full width at half maximum of less than or equal to about 42 nanometers, wherein the green emission layer includes a plurality of green light emitting quantum dots, and the green pixel exhibits a electroluminescence peak wavelength in a range of about 525 nanometers to about 536 nanometers and a full width at half maximum of less than or equal to about 39 nanometers, wherein the blue emission layer includes a plurality of blue light emitting quantum dots, and the blue pixel exhibits a electroluminescence peak wavelength in a range of about 440 nanometers to about 460 nanometers and a full width at half maximum of less than or equal to about 33 nanometers, and wherein the device has a color reproducibility according to a DCI standard of greater than or equal to about 89 percent.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other advantages and features of this disclosure will become more apparent by describing in further detail exemplary embodiments thereof with reference to the accompanying drawings, in which.

DETAILED DESCRIPTION

Figure 1:
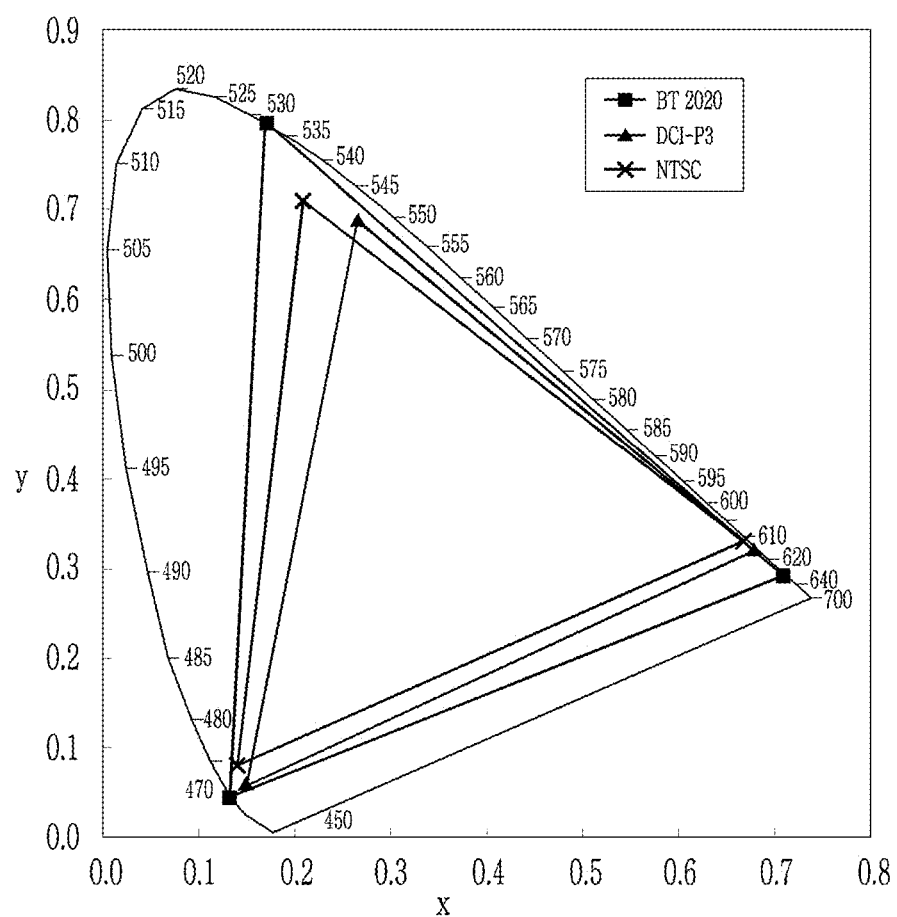
FIG. 1 is a graph of x color coordinate versus y color coordinate, and shows a DCI standard color gamut, an NTSC standard color gamut, and a BT2020 standard color gamut in a CIE color coordinate diagram.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary shall not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise. Thus the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, "substituted" refers to a compound or a moiety wherein at least one of hydrogen atoms thereof is replaced by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxyl group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—COOR, wherein R is a C1 to C6 an alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, a hydrocarbon group refers to a group including carbon and hydrogen (e.g., an alkyl, alkenyl, alkynyl, or aryl group). The hydrocarbon group may be monovalent, or have a greater valence, formed by removal of one or more hydrogen atoms from alkane, alkene, alkyne, or arene. In the hydrocarbon group, at least one methylene may be replaced by an oxide moiety, a carbonyl moiety, an ester moiety, —NH—, or a combination thereof.

As used herein, "alkyl" refers to a linear or branched saturated monovalent hydrocarbon group (methyl, ethyl, hexyl, etc.).

As used herein, "alkenyl" refers to a linear or branched monovalent hydrocarbon group having one or more carbon-carbon double bond.

As used herein, "alkynyl" refers to a linear or branched monovalent hydrocarbon group having one or more carbon-carbon triple bond.

As used herein, "aryl" refers to a group formed by removal of at least one hydrogen from an aromatic hydrocarbon (e.g., a phenyl or naphthyl group).

As used herein, "hetero" refers to one including one or more (e.g., 1 to 3) heteroatom of N, O, S, Si, P, or a combination thereof.

As used herein, "Group" refers to a group of Periodic Table.

As used herein, when a definition is not otherwise provided, a full width at half maximum (FWHM) refers to a full width at half maximum (FWHM) of a maximum emission peak in an electroluminescence spectrum of the quantum dot.

Herein, color reproducibility based on the Digital Cinema Initiatives (DCI) standard and color reproducibility based on the International Telecommunication Union Recommendation (ITU-R) Recommendation BT.2020, abbreviated the "BT2020" standard, refers to matching a color gamut of an electroluminescent display device with respect to a color gamut according to each standard (e.g., a ratio of an area of the matching portion to a total area of the standard color gamut) in a Commission internationale de l'éclairage (CIE) chromaticity diagram (i.e., color coordinate) as shown in FIG. 1.

Semiconductor nanocrystal particles (hereinafter, also referred to as a quantum dots) are nanocrystals having a size smaller than a diameter of the Bohr excitation in the bulk crystal of the same material. Because of the size of the core of the nanocrystals, quantum confinement of electrons, holes, and excitons occurs, enabling light emission corresponding to a bandgap energy of the core of the nanocrystal. The bandgap energy of a quantum dot may change according to size, structure, and composition of the quantum dot. For example, as the size of a quantum dot increases, the quantum dot may have a narrowed bandgap energy and an increased emission wavelength. Such semiconductor nanocrystals have drawn attention as a light emitting material in various fields, e.g., as a display device, as an energy storage device, or a bio-luminescent device.

Most quantum dots having electroluminescence properties suitable for actual application are based on cadmium (Cd). Cadmium has disadvantageous environmental and/or health issues, and is one of the restricted elements defined under Restriction of Hazardous Substances Directive (RoHS) in a plurality of countries. Thus, in order to be applied to a QLED display device, a quantum dot having a relatively narrow full width at half maximum (FWHM) and capable of emitting light of pure blue (e.g., a photoluminescence (PL) peak around 455 nm) is desired. However, a blue light emitting quantum dot capable of providing this emission has yet to be reported. Currently, there is no quantum dot-based electroluminescent display device which provides a suitable high color reproducibility based on the DCI color standard, as shown in FIG. 1, or a next generation color standard, e.g., the BT2020 standard, and provides with a desirable level of electroluminescence properties, and does not include a metal having undesirable properties, such as cadmium.

An electroluminescent display device according to an embodiment includes a red pixel, a green pixel, and a blue pixel. The display device includes a first electrode and a second electrode facing each other; and a quantum dot emission layer disposed between the first electrode and the second electrode, wherein the quantum dot emission layer includes a plurality of quantum dots and does not include cadmium (or a toxic heavy metal such as cadmium, lead, or mercury).

The quantum dot emission layer includes a red emission layer disposed in the red pixel, a green emission layer disposed in the green pixel, and a blue emission layer disposed in the blue pixel.

The red emission layer includes a plurality of (e.g., non-cadmium) red light emitting quantum dots, whereby the red pixel exhibits an electroluminescence (EL) peak wavelength in a range of about 627 nanometers (nm) to about 640 nm, about 628 nm to about 639 nm, about 630 nanometers (nm) to about 638 nm, or about 627 nanometers (nm) to about 628 nm and has a full width at half maximum (FWHM) of less than or equal to about 42 nm, e.g., about 5 nm to about 42 nm, about 7 nm to about 40 nm, or about 9 nm to about 38 nm or about 35 nm to about 42 nm).

The green emission layer includes a plurality of (e.g., non-cadmium) green light emitting quantum dots, whereby the green pixel exhibit an electroluminescence peak wavelength in a range of about 525 nm to about 536 nm, about 526 nm to about 535 nm, or about 527 nanometers (nm) to about 534 nm, and has a full width at half maximum (FWHM) of less than or equal to about 39 nm, of less than or equal to about 38 nm, of less than or equal to about 37 nm, or of less than or equal to about 36 nm, e.g., about 5 nm to about 39 nm, about 7 nm to about 40 nm, or about 9 nm to about 38 nm. The blue emission layer includes a plurality of (e.g., non-cadmium) blue light emitting quantum dots, whereby, the blue pixel exhibits an electroluminescence peak wavelength in a range of about 440 nm to about 460 nm, about 441 nm to about 459 nm, or about 442 nm to about 458 nm, or about 449 nm to about 454 nm and has a full width at half maximum (FWHM) of less than or equal to about 33 nm or less than or equal to about 20 nm, e.g., about 5 nm to about 33 nm, about 7 nm to about 33 nm, or about 9 nm to about 33 nm or about 19 nm to about 33 nm).

The device may have a color reproducibility according to a DCI standard of greater than or equal to about 89 percent (%), e.g., about 89% to about 101%, or about 90% to about 100%. The device may have a color reproducibility according to a BT2020 standard of greater than or equal to about 66%, e.g., about 66% to about 99%, or about 68% to about 98%, or about 72% to about 99%, or about 74% to about 98% or 71-85%. The device may have a color reproducibility according to a DCI standard of greater than or equal to about 94%, e.g., about 94.5% to about 99.9%, or about 95% to about 99%.

The first electrode may include an anode and the second electrode may include a cathode. Alternatively, the first electrode may include a cathode and the second electrode may include an anode.

Figure 2:
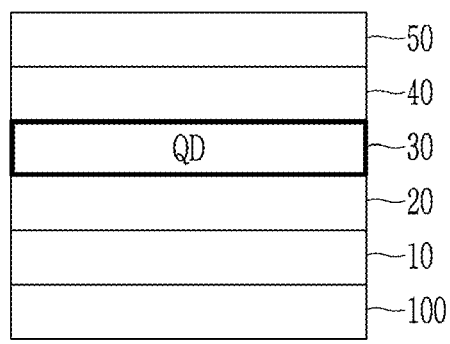
FIG. 2 is a schematic cross-sectional view of an embodiment of a QD LED device.
Figure 3:
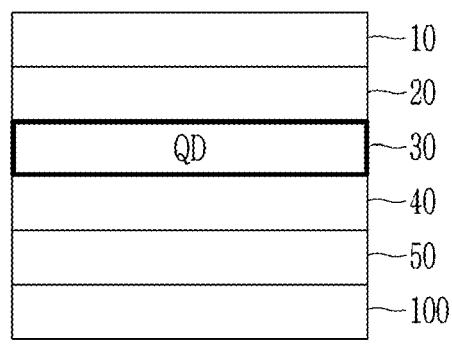
FIG. 3 is a schematic cross-sectional view of an embodiment of a QD LED.

An embodiment of a device is shown in FIGS. 2 and 3. The cathode 50 may include an electron injection conductor. The anode 10 may include a hole injection conductor. A work functions of the electron injection conductor included in the cathode, and the hole injection conductor of the anode may be appropriately selected and are not particularly limited. For example, the cathode may have a work function which is less than a work function of the anode. In an alternative embodiment, the anode may have a work function which is less than a work function of the cathode.

The electron injection conductor and the hole injection conductor may each independently include a metal-based material (e.g., a metal, a metal compound, an alloy, or a combination thereof), other conductive material, or a combination thereof. The metal may comprise aluminum, magnesium, tungsten, nickel, cobalt, platinum, palladium, or calcium, or a combination thereof. The metal compound or other conductive material may be a metal oxide, such as gallium indium oxide or indium tin oxide (ITO), or material having metallic properties, such as a conductive polymer, such as polyethylene dioxythiophene, e.g., a polymeric material (for example, having a relatively high work function, but is not limited thereto.

At least one of the first electrode and the second electrode may be a light transmitting electrode or a transparent electrode. In an embodiment, both of the first electrode and the second electrode may be light transmitting electrodes. The first electrode and the second electrode may each independently be patterned. The first electrode and/or the second electrode may each independently be disposed on a substrate. The substrate may be an insulating substrate. The substrate may be optically transparent, e.g., having a transparency of greater than or equal to about 50%, greater than or equal to about 60%, greater than or equal to about 70%, greater than or equal to about 80%, greater than or equal to about 85%, or greater than or equal to about 90% and less than or equal to about 99%, or less than or equal to about 95%. The substrate may include a region for a red pixel, a region for a green pixel, and a region for a blue pixel. A thin film transistor may be disposed in each region of the substrate, and at least one of a source electrode and a drain electrode of the thin film transistor may be electrically connected to the first electrode or the second electrode.

The light transmitting electrode may be disposed on a transparent substrate (e.g., insulating transparent substrate). The substrate may be rigid or flexible. The substrate may be a plastic, glass, or a metal.

The light transmitting electrode may comprise, for example, a transparent conductor, such as, for example, indium tin oxide (ITO) or indium zinc oxide (IZO), gallium indium tin oxide, zinc indium tin oxide, titanium nitride, polyaniline, or LiF/Mg:Ag, or a metal thin film, a monolayer or multilayer of a metal such as Ag, Au, Pt, or a combination thereof, but is not limited thereto. In an embodiment in which the first electrode or the second electrode is a non-light transmitting electrode, it may comprise, for example, an opaque conductor, such as, for example, aluminum (Al), a lithium aluminum (Li:Al) alloy, a magnesium-silver alloy (Mg:Ag), or lithium fluoride-aluminum (LiF:Al).

A thicknesses of the electrode (the first electrode and/or the second electrode) is not particularly limited, and each may independently be selected in a consideration of device efficiency. For example, the thickness of the electrode may be greater than or equal to about 5 nm, for example, greater than or equal to about 10 nm, greater than or equal to about 20 nm, greater than or equal to about 30 nm, greater than or equal to about 40 nm, or greater than or equal to about 50 nm, but is not limited thereto. For example, the thickness of the electrode may be less than or equal to about 100 µm, for example, less than or equal to about 90 µm, less than or equal to about 80 µm, less than or equal to about 70 µm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

The quantum dot emission layer 30 disposed between the first electrode and the second electrode (e.g., anode 10 and cathode 50) includes a plurality of quantum dots. The plurality of quantum dots may not include cadmium, e.g., is cadmium-free. In an embodiment, a cadmium content of the plurality of quantum dots may be about 0.01 part per million (ppm) to about 100 ppm, or about 0.01 ppm to about 10 ppm, based on a total content of the plurality of quantum dots. The quantum dot emission layer may include a single or a plurality of (e.g., about 2 to about 10, or about 2 or greater or about 3 or greater) monolayer(s), each including a plurality of quantum dots. The plurality of quantum dots may include a quantum dot having a core-shell structure.

The quantum dot emission layer may be patterned. In an embodiment, the patterned quantum dot emission layer includes a red emission layer disposed in the red pixel, a green emission layer disposed in the green pixel, and a blue emission layer disposed in the blue pixel.

The red emission layer includes a plurality of red light emitting quantum dots. The red pixel may have an electroluminescence (EL) peak wavelength in a range of greater than or equal to about 627 nm, for example, greater than or equal to about 628 nm, and less than or equal to about 640 nm, for example about 628 nm to about 639 nm, or about 630 nm to about 638 nm. The red pixel may exhibit a full width at half maximum (FWHM) of less than or equal to about 42 nm, for example, less than or equal to about 40 nm, e.g., about 5 nm to about 42 nm, about 7 nm to about 40 nm, or about 9 nm to about 38 nm or about 30 nm to about 42 nm. In an embodiment, the red pixel may exhibit a full width at half maximum (FWHM) of less than or equal to about 36 nm.

The green emission layer includes a plurality of green light emitting quantum dots. The green pixel may exhibit an electroluminescence peak wavelength in a range of about 525 nm to about 536 nm, about 526 nm to about 535 nm, or about 527 nm to about 534 nm. The green pixel may exhibit a full width at half maximum (FWHM) of less than or equal to about 39 nm, for example less than or equal to about 38 nm, about 5 nm to about 39 nm, about 7 nm to about 40 nm, about 9 nm to about 38 nm or 30-39 nm. In an embodiment, the green pixel may exhibit a full width at half maximum (FWHM) of less than or equal to about 37 nm.

The blue emission layer includes a plurality of blue light emitting quantum dots. The blue pixel may exhibit an electroluminescence peak wavelength in a range of greater than or equal to about 440 nm, for example, greater than or equal to about 445 nm, greater than or equal to about 450 nm, or greater than or equal to about 451 nm and less than or equal to about 460 nm, for example, less than or equal to about 458 nm, or less than or equal to about 455 nm, e.g., about 441 nm to about 459 nm, or about 442 nm to about 458 nm, and a full width at half maximum (FWHM) of less than or equal to about 43 nm, less than or equal to about 40 nm, less than or equal to about 38 nm, less than or equal to about 37 nm, less than or equal to about 36 nm, less than or equal to about 35 nm, less than or equal to about 34 nm, or less than or equal to about 33 nm (e.g., and greater than or equal to about 12 nm, greater than or equal to about 15 nm, greater than or equal to about 18 nm, greater than or equal to about 19 nm). In an embodiment, the blue pixel may exhibit a full width at half maximum (FWHM) of less than or equal to about 30 nm or less than or equal to about 20 nm, about 5 nm to about 33 nm, about 7 nm to about 33 nm, or about 9 nm to about 33 nm.

The electroluminescent display device including the aforementioned emission layer and the aforementioned pixel according to an embodiment may have a color reproducibility according to a DCI standard of greater than or equal to about 89%, e.g., about 89% to about 99%, or about 90% to about 98%. The device may have a color reproducibility according to a BT2020 standard of greater than or equal to about 66%, e.g., about 66% to about 99%, or about 68% to about 98%, or about 72% to about 99%, or about 74% to about 98%. The device may have a color reproducibility according to a DCI standard of greater than or equal to about 89%, and a color reproducibility according to a BT2020 standard of greater than or equal to about 69%. The device may have a color reproducibility according to a DCI standard of greater than or equal to about 94%. The device may have a color reproducibility according to a BT2020 standard of greater than or equal to about 71%.

In an embodiment, the red emission layer may emit light having Cx of greater than or equal to about 0.64, for example, greater than or equal to about 0.65, or greater than or equal to about 0.66 in a CIE color coordinate, e.g., about 0.64 to about 0.8, about 0.65 to about 0.75, or about 0.66 to about 70 in a CIE color coordinate. The red emission layer may emit light having Cx of 0.66-0.71, Cy 0.29-0.34. In an embodiment, the green emission layer may emit light having Cy of greater than or equal to about 0.64, for example, greater than or equal to about 0.65, greater than or equal to about 0.66, greater than or equal to about 0.67, greater than or equal to about 0.68, or greater than or equal to about 0.69 in a CIE color coordinate, e.g., about 0.64 to about 0.8, about 0.65 to about 0.75, or about 0.66 to about 70 in a CIE color coordinate. The green emission layer may emit light having Cx of 0.19-0.26, Cy 0.68-0.72. In an embodiment, the blue emission layer may emit light having Cx of greater than or equal to about 0.1, for example, greater than or equal to about 0.12, greater than or equal to about 0.13, or greater than or equal to about 0.14, and less than or equal to about 0.2, for example, less than or equal to about 0.19, less than or equal to about 0.18, less than or equal to about 0.17, or less than or equal to about 0.16, and Cy of greater than or equal to about 0.02, greater than or equal to about 0.03, greater than or equal to about 0.04, greater than or equal to about 0.05, greater than or equal to about 0.06, greater than or equal to about 0.07, greater than or equal to about 0.08, or greater than or equal to about 0.09, and less than or equal to about 0.2, less than or equal to about 0.19, less than or equal to about 0.18, less than or equal to about 0.17, less than or equal to about 0.16, less than or equal to about 0.15, less than or equal to about 0.14, less than or equal to about 0.13, less than or equal to about 0.12, less than or equal to about 0.11, or less than or equal to about 0.1, in a CIE color coordinate. The blue emission layer may emit light having Cx of 0.145-0.15, Cy 0.05-0.09.

An embodiment in which the blue emission layer emits light having Cx of about 0.1 to about 0.16, and a Cy of about 0.02 to about 0.2 is mentioned.

The red light emitting quantum dots may comprise a red light emitting semiconductor nanocrystal particle including a core including indium (In), phosphorus (P), and optionally zinc (Zn), and a shell disposed on a surface of the core and including zinc, sulfur, and optionally selenium. In the red light emitting semiconductor nanocrystal particle, the core may include InP or InZnP, and the shell may include ZnS or ZnSeS. The shell may be a multi-layered shell having at least a plurality of layers, e.g., about 2 to about 10 layers, or about 3 to about 7 layers, and in an embodiment each layer may have a different composition. The shell may have a varied composition in a radial direction. In an embodiment the shell has a compositional gradient which varies in a radial direction.

The red light emitting semiconductor nanocrystal particle may have a photoluminescence peak wavelength of greater than or equal to about 620 nm, for example, greater than or equal to about 622 nm, greater than or equal to about 623 nm, greater than or equal to about 624 nm, greater than or equal to about 625 nm, greater than or equal to about 626 nm, greater than or equal to about 627 nm, and less than or equal to about 640 nm, for example, less than or equal to about 637 nm, less than or equal to about 635 nm, less than or equal to about 630 nm, about 620 nm to about 639 nm, or about 622 nanometers (nm) to about 637 nm. The photoluminescence peak of the red light emitting semiconductor nanocrystal particle may have a full width at half maximum (FWHM) of less than or equal to about 41 nm, of less than or equal to about 40 nm, of less than or equal to about 39 nm, of less than or equal to about 38 nm, of less than or equal to about 37 nm, or of less than or equal to about 36 nm, e.g., about 5 nm to about 42 nm, about 7 nm to about 40 nm, or about 9 nm to about 38 nm. The red light emitting semiconductor nanocrystal particle may have a photoluminescence quantum efficiency of greater than or equal to about 80%, for example, greater than or equal to about 85%, greater than or equal to about 89%, or greater than or equal to about 90%, e.g., about 80% to about 99%, or about 85% to about 98%.

The red light emitting semiconductor nanocrystal particle may have a spherical shape, a polygonal shape, a multipod shape, or a combination thereof. The red light emitting semiconductor nanoparticle may have a (e.g., average) size of greater than or equal to about 5 nm, for example, greater than or equal to about 6 nm, and less than or equal to about 10 nm, for example, less than or equal to about 9 nm or less than or equal to about 8.8 nm. As used herein, the size of the quantum dot refers to a diameter of the quantum dot, or (when it is a non-spherical shape) a diameter that is determined assuming that the particle has a spherical shape from a two-dimensional (2D) image when analyzed by electron microscopic analysis, e.g. SEM.

The red light emitting semiconductor nanoparticle may have a shell having a thickness of greater than or equal to about 1 nm, for example, greater than or equal to about 1.5 nm, greater than or equal to about 1.6 nm, greater than or equal to about 1.7 nm, or greater than or equal to about 1.8 nm, and less than or equal to about 3 nm, for example, less than or equal to about 2.9 nm, less than or equal to about 2.8 nm, less than or equal to about 2.7 nm, less than or equal to about 2.6 nm, or less than or equal to about 2.5 nm. The shell of the red light emitting semiconductor nanocrystal particle may a varied composition, e.g., a compositional gradient, in a radial direction. For example, when the shell includes ZnSeS, an amount of the sulfur may increase in a radial direction from the core to the outermost layer, where the shell may include ZnS. In an embodiment, the outermost layer of the shell consists of ZnS. In an embodiment, an innermost layer of the shell consists of ZnSe, or ZnSeS.

In the red light emitting semiconductor nanocrystal particle, an amount of phosphorus relative to 1 mole of indium may be less than or equal to about 4 moles, for example, less than or equal to about 3 moles, less than or equal to about 2 moles, less than or equal to about 1 mole, or less than or equal to about 0.9 moles. In the red light emitting semiconductor nanocrystal particle, the amount of phosphorus relative to 1 mole of indium may be greater than or equal to about 0.5 moles, for example, greater than or equal to about 0.7 moles, greater than or equal to about 0.77 moles, and less than or equal to about 1 mole. In the red light emitting semiconductor nanocrystal particle, an amount of sulfur relative to 1 mole of indium may be greater than or equal to about 3 moles, for example, greater than or equal to about 4 moles, and less than or equal to about 9 moles, for example, less than or equal to about 8 moles. In the red light emitting semiconductor nanocrystal particle, an amount of zinc relative to 1 mole of indium may be greater than or equal to about 2 moles, for example, greater than or equal to about 2.5 moles, greater than or equal to about 3 moles, greater than or equal to about 4 moles, greater than or equal to about 5 moles, greater than or equal to about 6 moles, or greater than or equal to about 7 moles, and less than or equal to about 30 moles, for example, less than or equal to about 25 moles, or less than or equal to about 20 moles. In the red light emitting semiconductor nanocrystal particle, an amount of selenium relative to 1 mole of indium may be greater than or equal to about 0.8 moles, for example greater than or equal to about 0.9 moles, greater than or equal to about 1 mole, and less than or equal to about 10 moles, for example, less than or equal to about 9 moles. In the red light emitting semiconductor nanocrystal particle, a total amount of S and Se, relative to 1 mole of Zn, may be less than or equal to 1 mole, for example, less than about 1 mole and greater than or equal to about 0.5 moles, for example, greater than or equal to about 0.6 moles, greater than or equal to about 0.7 moles, greater than or equal to about 0.8 moles, or greater than or equal to about 0.9 moles.

The green light emitting quantum dots may comprise a green light emitting semiconductor nanocrystal particle including a core including indium (In), phosphorus (P), and optionally zinc (Zn), and a shell disposed on a surface of the core and including zinc, sulfur, and optionally selenium.

In the green light emitting semiconductor nanocrystal particle, the core may include InP or InZnP, and the shell may include ZnS or ZnSeS.

The green light emitting semiconductor nanocrystal particle may have a photoluminescence (PL) peak wavelength of greater than or equal to about 524 nm, or greater than or equal to about 525 nm, and less than or equal to about 545 nm, or less than or equal to about 536 nm, about 526 nm to about 545 nm, or about 527 nanometers (nm) to about 535 nm. The green light emitting semiconductor nanocrystal particle may have a photoluminescence (PL) peak wavelength of greater than or equal to about 520 nm, or greater than or equal to about 524 nm and less than or equal to about 535 nm. The photoluminescence (PL) peak of the green light emitting semiconductor nanocrystal particle may have a full width at half maximum (FWHM) of less than or equal to about 40 nm, for example, less than or equal to about 38 nm, less than or equal to about 36 nm, or less than or equal to about 35 nm, e.g., about 5 nm to about 39 nm, about 7 nm to about 40 nm, or about 9 nm to about 38 nm. The green light emitting semiconductor nanocrystal particle may have a photoluminescence quantum efficiency of greater than or equal to about 80%, for example, greater than or equal to about 85%, e.g., about 85% to about 99%, or about 90% to about 98%.

The green light emitting semiconductor nanocrystal particle may have a spherical shape, a polygonal shape, a multipod shape, or a combination thereof. The green light emitting semiconductor nanoparticle may have a (e.g. average) size of greater than or equal to about 6 nm, for example greater than or equal to about 6.5 nm, or greater than or equal to about 7 nm, and less than or equal to about 15 nm, for example, less than or equal to about 10 nm, less than or equal to about 9 nm, or less than or equal to about 8 nm.

The green light emitting semiconductor nanoparticle may have a shell thickness of greater than or equal to about 2 nm, and less than or equal to about 5 nm. The shell of the green light emitting semiconductor nanocrystal particle may have a varied composition, e.g., a compositional gradient, in a radial direction. For example, when the shell includes ZnSeS, an amount of the sulfur may increase in a radial direction from the core to the outermost layer of the shell, where the shell may include ZnS. In an embodiment, the outermost layer consists of ZnS. In an embodiment, the innermost layer of the shell consists of ZnSe, or ZnSeS.

In the green light emitting semiconductor nanocrystal particle, an amount of phosphorus relative to 1 mole of indium may be less than or equal to about 1 moles. In the green light emitting semiconductor nanocrystal particle, an amount of phosphorus relative to 1 mole of indium may be greater than or equal to about 0.6 moles, for example, greater than or equal to about 0.7 moles. In the green light emitting semiconductor nanocrystal particle, an amount of sulfur relative to 1 mole of indium may be greater than or equal to about 5 moles, for example, greater than or equal to about 9 moles, or greater than or equal to about 12 moles, and less than or equal to about 70 moles, for example, less than or equal to about 45 moles, or less than or equal to about 38 moles. In the green light emitting semiconductor nanocrystal particle, an amount of zinc relative to 1 mole of indium may be greater than or equal to about 20 moles, for example, greater than or equal to about 25 moles, greater than or equal to about 30 moles, greater than or equal to about 33 moles, greater than or equal to about 34 moles, or greater than or equal to about 35 moles, and less than or equal to about 150 moles, for example, less than or equal to about 75 moles, less than or equal to about 70 moles, or less than or equal to about 68 moles. In the green light emitting semiconductor nanocrystal particle, an amount of selenium relative to 1 mole of indium may be greater than or equal to about 5 moles, for example, greater than or equal to about 10 moles, greater than or equal to about 11 moles, or greater than or equal to about 12 moles, and less than or equal to about 50 moles, for example less than or equal to about 20 moles, or less than or equal to about 18 moles. In the green light emitting semiconductor nanocrystal particle, a total amount of S and Se, relative to 1 mole of Zn, may be less than about 1, for example, less than or equal to about 0.9, and greater than or equal to about 0.7, for example, greater than or equal to about 0.75, or greater than or equal to about 0.8.

The blue light emitting quantum dots may comprise a blue light emitting semiconductor nanocrystal particle including zinc, tellurium, and selenium. In an embodiment of the blue light emitting semiconductor nanocrystal particle, the content of tellurium is less than a content of selenium. The blue light emitting semiconductor nanocrystal particle may have a core including a first semiconductor material including zinc, tellurium, and selenium, and a shell including a second semiconductor material having a different composition than the first semiconductor material (and for example, including Zn, Se, and S), and the shell may be disposed on the core. The shell may be disposed on a portion of the core, or on an entirety of the core.

The first semiconductor material of the core may include a limited amount of tellurium (Te). The core may include $ZnTe_xSe_{1-x}$, wherein, x is greater than about 0 and less than or equal to about 0.05. In the core, by increasing a ratio of a tellurium amount relative to a selenium amount, a wavelength of the maximum emission peak of the semiconductor nanocrystal particle may increase. In the core, the tellurium amount may be greater than or equal to about 0.001 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, or greater than or equal to about 0.02 moles, based on 1 mole of selenium. In the core, the tellurium amount may be less than or equal to about 0.053 moles, for example, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, or less than or equal to about or 0.04 moles, based on 1 mole of selenium. Without being bound by any particular theory, the core may have various forms in terms of distributions of Zn, Se, and Te. In an embodiment, the core is homogeneous. In an embodiment, the core comprises compositional gradient in which the content of Se varies in a direction from a center of the core to an outer surface of the core. In an embodiment, the core comprises compositional gradient in which the content of Te varies in a direction from a center of the core to an outer surface of the core.

The second semiconductor material may include zinc (Zn), selenium (Se), and sulfur (S). The shell may be a multi-layered shell. The multi-layered shell may include a first layer disposed directly on the core, and an outermost layer, wherein the first layer may include ZnSeS and the outermost layer may include ZnS. In an embodiment, the first layer consists of ZnSeS, and the outermost layer consists of ZnS. The shell may include a gradient alloy and a sulfur amount may have a concentration gradient, wherein the sulfur amount increases in a direction, e.g., radial direction, away from the core.

The semiconductor nanocrystal particle may have a ratio, e.g., a mole ratio, of an amount of the tellurium relative to that of selenium (e.g., measured by inductively coupled plasma-atomic emission spectroscopy (ICP-AES)) of less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01. The mole ratio of the tellurium relative to the selenium may be greater than or equal to about 0.001, greater than or equal to about 0.002, greater than or equal to about 0.003, greater than or equal to about 0.004, greater than or equal to about 0.005, greater than or equal to about 0.006, or greater than or equal to about 0.007. The mole ratio of the tellurium relative to the selenium may be about 0.004 to about 0.025.

In the blue light emitting semiconductor nanocrystal particle, an amount of the zinc may be greater than an amount of the selenium. The blue light emitting semiconductor nanocrystal particle may have a mole ratio of the tellurium relative to the zinc (e.g., determined by inductively coupled plasma-atomic emission spectroscopy) of less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, or less than or equal to about 0.011, e.g., about 0.001 to about 0.02, about 0.002 to about 0.01, or about 0.005.

In the blue light emitting semiconductor nanocrystal particle, an amount of zinc (Zn) (e.g., when analyzed by an ICP-AES analysis) may be greater than an amount of selenium (Se), and the amount of selenium may be greater than an amount of tellurium.

For example, when analyzed by ICP-AES analysis, a mole ratio of Se relative to Zn may be less than about 1, for example, less than or equal to about 0.95, less than or equal to about 0.90, less than or equal to about 0.85, less than or equal to about 0.8, less than or equal to about 0.7, less than or equal to about 0.6, less than or equal to about 0.5, or less than or equal to about 0.4. The mole ratio of Se relative to Zn may be greater than or equal to about 0.05, for example, greater than or equal to about 0.1, or greater than or equal to about 0.2.

For example, when analyzed by ICP-AES analysis, a mole ratio of Te relative to Zn may be less than or equal to about 0.03, for example, less than or equal to about 0.027, less than or equal to about 0.025, less than or equal to about 0.02, less than or equal to about 0.019, less than or equal to about 0.018, less than or equal to about 0.017, 0.016, less than or equal to about 0.015, less than or equal to about 0.01, less than or equal to about 0.009, less than or equal to about 0.008, less than or equal to about 0.007, less than or equal to about 0.006, or less than or equal to about 0.005. The mole ratio of Te relative to Zn may be greater than or equal to about 0.001, greater than or equal to about 0.002, or greater than or equal to about 0.003. In the blue light emitting semiconductor nanocrystal particle according to an embodiment, an amount of tellurium may be less than or equal to about 1 weight percent (wt %), e.g., about 0.01 wt % to about 1 wt %, or about 0.05 wt % to about 0.5 wt %, based on a total weight of the semiconductor nanocrystal particle. The blue light emitting semiconductor nanocrystal particle does not include cadmium. In an embodiment, a cadmium content of the blue light emitting semiconductor nanocrystal particle may be about 0.01 part per million (ppm) to about 100 ppm, or about 0.01 ppm to about 10 ppm, based on a total content of the plurality of quantum dots. The (blue light emitting) semiconductor nanocrystal particle may not include manganese, copper, or a combination thereof.

In the blue light emitting semiconductor nanocrystal particle, a mole ratio of sulfur relative to Zn may be greater than or equal to about 0.1, for example, greater than or equal to about 0.15, greater than or equal to about 0.2, or greater than or equal to about 0.3. In the semiconductor nanocrystal particle, a mole ratio of sulfur relative to Zn may be less than or equal to about 0.9, for example, less than or equal to about 0.8, less than or equal to about 0.7, or less than or equal to about 0.6. In the semiconductor nanocrystal particle, a mole ratio of Se+S relative to zinc may be greater than or equal to about 0.3, greater than or equal to about 0.4, or greater than or equal to about 0.5. In the semiconductor nanocrystal particle, a mole ratio of a total of Se and S, relative to zinc, may be less than or equal to about 1, for example, less than about 1 and greater than or equal to about 0.5, for example, greater than or equal to about 0.6, greater than or equal to about 0.7, or greater than or equal to about 0.8. A ratio of sulfur relative to selenium may be greater than or equal to about 0.5 and less than or equal to about 2.

The blue light emitting semiconductor nanocrystal particle may have a spherical shape, a polygonal shape, a multipod shape, or a combination thereof. In an embodiment, the semiconductor nanocrystal particle may have a multipod shape. The multipod may have a plurality, e.g., about 2 about 10, or about 3 to about 5 branch portions and valley portions therebetween. An average size of the core may be greater than or equal to about 2 nm, greater than or equal to about 3 nm, or greater than or equal to about 4 nm. The average size of the core may be less than or equal to about 6 nm, for example, less than or equal to about 5 nm. The blue light emitting semiconductor nanocrystal may have a size (or an average size, hereinafter referred to as size) of greater than or equal to about 3 nm, for example, greater than or equal to about 4 nm, greater than or equal to about 5 nm, greater than or equal to about 6 nm, greater than or equal to about 7 nm, greater than or equal to about 8 nm. The blue light emitting semiconductor nanocrystal may have a size of less than or equal to about 30 nm, for example, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm.

The blue light emitting semiconductor nanocrystal particle according to an embodiment may have a photoluminescence peak wavelength of greater than or equal to about 430 nm, e.g., greater than or equal to about 440 nm, greater than or equal to about 446 nm, greater than or equal to about 449 nm, or greater than or equal to about 450 nm, and less than or equal to about 470 nm, e.g., less than about 470 nm, less than or equal to about 461 nm or less than or equal to about 460 nm.

The blue light emitting semiconductor nanocrystal particle may have a maximum photoluminescence peak wavelength of about 450 nm to about 460 nm. The maximum photoluminescence peak thereof may have a full width at half maximum (FWHM) of less than or equal to about 50 nm, for example, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm, and greater than or equal to about 12 nm, greater than or equal to about 20 nm, greater than or equal to about 25 nm, or greater than or equal to about 26 nm, e.g., about 2 nm to about 50 nm, about 4 nm to about 45 nm, or about 6 nm to about 40 nm.

The blue light emitting semiconductor nanocrystal may have quantum efficiency of greater than or equal to about 60%, for example, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, or greater than or equal to about 69%. The semiconductor nanocrystal may have quantum efficiency of greater than or equal to about 80%, greater than or equal to about 90%, greater than or equal to about 95%, greater than or equal to about 99%, or about 100%, e.g., a quantum efficiency of about 60% to about 99.9%, about 70% to about 99%, or about 75% to about 98%.

A cadmium-based core-shell semiconductor nanocrystal, such as, for example, CdSe/CdS, may exhibit high emission properties and stability against photooxidation by passivation of the surface of the nanocrystal. Surfaces of these nanocrystals may be capped by an inorganic shell having a wide bandgap. While not wanting to be bound by theory, it is understood that the inorganic shell passivates the surface of the nanocrystal, effectively removes a dangling bond or a coordination portion, if present, that can form a trap for carriers formed inside the nanocrystal, whereby photo-generated carriers may be confined inside the core, resulting in a relatively high luminous efficiency.

However, such a core-shell type semiconductor nanocrystal has a maximum emission wavelength (i.e., a central emission wavelength) of about 470 nm to about 630 nm, and it is difficult to have a maximum light emitting wavelength of less than about 470 nm. As the maximum emission wavelength of the semiconductor nanocrystal increases with an increase of a size of the nanocrystal, a core semiconductor nanocrystal having a very small size (e.g., less than 1.6 nm) is necessary in order to obtain a maximum emission wavelength of less than 470 nm. It is difficult to produce the core having such a size with a narrow size distribution. Formation of a shell on a core may cause an increase in the size (e.g., resulting in a red-shift) in a maximum emission peak wavelength of the semiconductor nanocrystal. Therefore, it is not easy to prepare a core-shell semiconductor nanocrystal having blue light emission. The blue light emitting semiconductor nanocrystal particle according to an embodiment may exhibit a maximum emission peak wavelength of less than about 470 nm, for example, less than or equal to about 465 nm, with relatively high quantum efficiency and a relatively narrow full width at half maximum (FWHM), even though it has a relatively large core size (e.g., about 2 nm or greater, for example, 3 nm or greater, or 4 nm or greater).

The red light emitting semiconductor nanocrystal particle, the green light emitting semiconductor nanocrystal particle, and the blue light emitting semiconductor nanocrystal particle having the aforementioned structure/composition may be produced in an appropriate method. In an embodiment, a method for producing the red light emitting semiconductor nanocrystal, the green light emitting semiconductor nanocrystal, and the blue light emitting semiconductor nanocrystal may include obtaining a core included in each semiconductor nanocrystal particle;

preparing a first shell precursor including a metal (e.g., zinc) and a first shell precursor solution including an organic ligand;

preparing a second shell precursor including a non-metal element (e.g., sulfur, selenium, or a combination thereof); and heating the first shell precursor solution to a second reaction temperature, and adding the core and the second shell precursor to the first shell precursor solution to form a shell of a second semiconductor nanocrystal on the core. The method may further include separation of the core after its synthesis from a reaction system that is used for its synthesis, and preparation of a core solution (or core dispersion) by dispersing the synthesized core in an organic solvent.

In an embodiment, in order to form the shell, the solvent and optionally the ligand compound are heated (or vacuum treated) to a predetermined temperature (e.g., 100° C. or greater) under vacuum, disposed in an inert gas atmosphere, and then heated to a predetermined temperature (e.g., 100° C. or greater) again. Subsequently, the core is added and the shell precursors are injected sequentially or simultaneously, and the reaction is performed by heating at a predetermined reaction temperature. A mixture of the shell precursors having different ratios may be sequentially injected during the reaction time.

The core for the red light emitting or green light emitting semiconductor nanocrystal particle may be appropriately produced. In an embodiment, the core for the red light emitting or green light emitting semiconductor nanocrystal particle may be produced by obtaining a first mixture including an indium precursor, an organic ligand, an organic solvent, and optionally a zinc precursor; pre-treating the first mixture at a temperature of greater than or equal to about 100° C. (e.g., 110° C. or greater) (e.g., under a vacuum) as needed; preparing a phosphorus precursor stock solution including a phosphorus precursor and an organic solvent; and heating the first mixture to a reaction temperature to add the phosphorus precursor stock solution thereinto, and to perform a reaction.

Types of the indium precursor are not particularly limited and may be appropriately selected. For example, the indium precursor may include an indium powder, an alkylated indium, e.g., a C1 to C4 indium compound (such as trimethyl indium), a C1 to C6 indium alkoxide, indium hydroxide, an indium carboxylate (e.g., indium acetate), indium nitrate, indium perchlorate, indium sulfate, indium acetylacetonate, indium halide, indium cyanide, indium oxide, or indium peroxide. A combination comprising at least two of the foregoing may be used.

Types of the zinc precursor are not particularly limited and may be appropriately selected. The zinc precursor may include a Zn metal powder, ZnO, an alkylated Zn compound (e.g., C2 to C30 dialkyl zinc such as diethyl zinc), a C1 to 6 Zn alkoxide (e.g., zinc ethoxide), a Zn carboxylate (e.g., zinc acetate), Zn nitrate, Zn perchlorate, Zn sulfate, Zn acetylacetonate, Zn halide (e.g., zinc chloride), Zn cyanide, Zn hydroxide, or a combination thereof. The zinc precursor may be in the form of a zinc precursor solution including the zinc precursor and an organic solvent/ligand. The zinc precursor solution may include an organic ligand in an organic solvent. The organic ligand may include a fatty acid and an amine compound. A concentration of the zinc precursor and a concentration of the organic ligand in the zinc precursor solution are not particularly limited and may be appropriately selected.

Types of the organic ligand and the organic solvent are not particularly limited and may be appropriately selected.

Types of the phosphorus precursor are not particularly limited and may be appropriately selected. For example, the phosphorus precursor may include tris(trimethylsilyl) phosphine, tris(dimethylamino) phosphine, triethylphosphine, tributylphosphine, trioctylphosphine, triphenylphosphine, tricyclohexylphosphine, or a combination thereof, but is not limited thereto.

Ratios among each compound in the reaction system (for example, the indium precursor, the zinc precursor, the phosphor precursor, the organic ligand, and the organic solvent) may be appropriately selected in a consideration of the composition of a desired quantum dot. The reaction time and temperature may be appropriately selected in a consideration of the size of the core to be synthesized but are not particularly limited thereto. For example, the reaction temperature for a core synthesis may be greater than or equal to about 270° C., and less than or equal to about 360° C., but is not limited thereto. The reaction time for the core synthesis may be greater than or equal to about 5 minutes, and less than about 1 hour but is not limited thereto.

The core for the blue light emitting semiconductor nanocrystal particle may be produced by a method including providing a zinc precursor solution including a zinc precursor and an organic ligand;

preparing a selenium precursor and a tellurium precursor; and heating the zinc precursor solution to a first reaction temperature, adding the selenium precursor and the tellurium precursor together with an organic ligand to the zinc precursor solution to form a first semiconductor nanocrystal core including zinc, selenium, and tellurium.

The zinc precursor for the blue light emitting semiconductor nanocrystal particle may include a Zn metal powder, ZnO, an alkylated Zn compound (e.g., C2 to C30 dialkyl zinc such as diethyl zinc), a C1 to C6 Zn alkoxide (e.g., zinc ethoxide), Zn carboxylate (e.g., zinc acetate), Zn nitrate, Zn perchlorate, Zn sulfate, Zn acetylacetonate, Zn halide (e.g., zinc chloride), Zn cyanide, Zn hydroxide, or a combination thereof. The zinc precursor solution may include an organic ligand in an organic solvent. The organic ligand may include fatty acids and amine compounds. A concentration of the zinc precursor and a concentration of the organic ligand in the zinc precursor solution are not particularly limited and may be appropriately selected.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto. The tellurium precursor may include tellurium-trioctylphosphine (Te-TOP), tellurium-tributylphosphine (Te-TBP), tellurium-triphenylphosphine (Te-TPP), or a combination thereof, but is not limited thereto.

An amount of the selenium precursor for forming the core may be greater than or equal to about 20 moles, for example, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles based on 1 mole of the tellurium precursor. The amount of the selenium precursor may be less than or equal to about 60 moles, less than or equal to about 59 moles, less than or equal to about 58 moles, less than or equal to about 57 moles, less than or equal to about 56 moles, or less than or equal to about 55 moles based on 1 mole of the tellurium precursor. Within the foregoing ranges of the amount, the core having the aforementioned composition may be formed.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours but is not limited thereto. By controlling the reaction time, the size of the core may be controlled.

Hereinafter, a shell precursor of the ZnSeS shell will be described in further detail, but the present disclosure is not limited thereto, and appropriate shell precursor may be selected in accordance with a shell composition.

In an embodiment, the first shell precursor may include zinc. The first shell precursor including zinc may be a zinc powder, a C2 to C30 alkylated zinc compound (e.g., a C2 to C30 dialkyl zinc), a C1 to C6 zinc alkoxide, a zinc carboxylate, a zinc nitrate, a zinc perchlorate, a zinc sulfate, a zinc acetylacetonate, a zinc halide, a zinc cyanide, a zinc hydroxide, ZnO, a zinc peroxide, or a combination thereof, but is not limited thereto. Examples of the first shell precursor may be dimethyl zinc, diethyl zinc, a zinc acetate, a zinc acetylacetonate, a zinc iodide, a zinc bromide, a zinc chloride, a zinc fluoride, a zinc carbonate, a zinc cyanide, a zinc nitrate, a zinc oxide, a zinc peroxide, a zinc perchlorate, a zinc sulfate, or a combination thereof.

The second shell precursor includes selenium, sulfur, or a combination thereof. The sulfur-containing precursor of the second shell precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The selenium-containing precursor of the second shell precursor may be selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

In an embodiment, after synthesis of the core and during a shell growth, a solution including the shell precursor may be added to a reaction system in stepwise in order for a composition of the shell to be varied. For example, in case that a shell of a ternary compound is formed, addition order and amounts, and reaction times of an first element precursor (e.g., a metal element such as Zn), a second element precursor (e.g., a first non-metal element such as sulfur), and a third element precursor (e.g., a second non-metal element such as Se) solutions may be selected. For example, the core is added to the first element precursor solution, the second element precursor solution is added thereto, and then a reaction is performed for a predetermined time. Subsequently, the third element precursor solution and the second element precursor solution may be added to the reaction system in a form of a mixture or individually, and then a reaction is performed. Herein, addition times of the third element precursor solution and the second element precursor solution and a ratio of these precursors in the reaction system may be controlled.

A lattice mismatch at the interface of the core and shell may be controlled at an appropriate time by controlling addition times of the third element precursor solution and the second element precursor solution and a ratio of the precursors in the reaction system. In addition, growth energy at the surface may be controlled by changing a reaction temperature and a type of the third element precursor.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a phosphine oxide (e.g. trioctylphosphine oxide) substituted with a (e.g., 1, 2, or 3) C6 to C22 alkyl group, a C12 to C22 aromatic ether such as a phenyl ether or a benzyl ether, or a combination thereof.

The organic ligand may coordinate the surface of the produced nanocrystal and render the nanocrystal to be well dispersed in the solution, as well as may have an effect on light emitting and electrical characteristics of the nanocrystal. The organic ligand may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, R$_2$POOH (wherein, R and R' are each independently a substituted or unsubstituted C1 (or C6 or higher, or C10 or higher) to C40 aliphatic hydrocarbon, or a substituted or unsubstituted C6 to C40 aromatic hydrocarbon, or a combination thereof), or a combination thereof. The ligand may be used alone or in a mixture of two or more compounds.

Specific examples of the organic ligand compound may be methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; phosphine such as methyl phosphine, ethyl phosphine, propyl phosphine, butyl phosphine, pentyl phosphine, tributylphosphine, or trioctylphosphine; a phosphine oxide compound such as methyl phosphine oxide, ethyl phosphine oxide, propyl phosphine oxide, butyl phosphine oxide, or trioctylphosphine oxide; a diphenyl phosphine or triphenyl phosphine compound, or an oxide compound thereof; phosphonic acid, and the like, but are not limited thereto. The organic ligand compound may be used alone or in a mixture of two or more compounds. In an embodiment, the organic ligand compound may be a combination of RCOOH and amine (e.g., RNH$_2$, R$_2$NH, and/or R$_3$N).

After the completion of the reaction, a nonsolvent is added to the reaction products, and the nanocrystal particles coordinated with the ligand compound may be isolated. The nonsolvent may be a polar solvent that is miscible with the solvent used in core formation and/or shell formation reactions and is not capable of dispersing the produced nanocrystals therein. The nonsolvent may be selected depending the solvent used in the reaction and may be, for example, acetone, ethanol, butanol, isopropanol, water, tetrahydrofuran (THF), dimethylsulfoxide (DMSO), diethylether, formaldehyde, acetaldehyde, ethylene glycol, a solvent having a similar solubility parameter to the foregoing non-solvents, or a combination thereof. Isolation of the nanocrystal particles may involve centrifugation, sedimentation, chromatography, or distillation. The separated nanocrystal particles may be added to a washing solvent and washed, if desired. Types of the washing solvent are not particularly limited and a solvent having a similar solubility parameter to that of the ligand may be used, and examples thereof may include hexane, heptane, octane, chloroform, toluene, benzene, and the like.

The semiconductor nanocrystal particle (e.g., the blue light emitting semiconductor nanocrystal particle) of the embodiment may not dispersable to water, any of the foregoing listed non-solvent, or a mixture thereof. The quantum dots of the embodiment may be water-insoluble. The quantum dots may be dispersed the aforementioned organic solvent. In some embodiments, the quantum dots may be dispersed in a C6 to C40 aliphatic hydrocarbon, a C6 to C40 aromatic hydrocarbon, or a mixture thereof.

The electroluminescent display device may include a charge (hole or electron) auxiliary layer between the first electrode and the second electrode (e.g., an anode and a cathode). For example, the electroluminescent display device may include a hole auxiliary layer 20 between the anode 10 and the quantum dot emission layer 30 and/or an electron auxiliary layer 40 between the cathode 50 and the quantum dot emission layer 30. (see FIGS. 2 and 3)

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be appropriately selected. For example, a thickness of each layer may be greater than or equal to about 1 nm, and less than or equal to about 500 nm, but is not limited thereto. The hole injection layer may be an organic layer including, such as, PEDOT:PSS, formed by a solution process (e.g., spin coating). The hole transport layer may also be an organic layer that is formed by a solution process (e.g., spin coating).

The electron auxiliary layer may include, for example, an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be appropriately selected. For example, a thickness of each layer may be greater than or equal to about 1 nm, and less than or equal to about 500 nm, but is not limited thereto. The electron injection layer may be an organic layer formed by deposition. The electron transport layer may include an inorganic oxide nanoparticle or may be an organic layer formed by deposition.

The quantum dot emission layer may be disposed in the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include, for example, an organic material, an inorganic material, or an organic/inorganic material. The organic material may be an organic compound having hole or electron-related properties. The inorganic material may be, for example, a metal oxide, such as, for example, molybdenum oxide, tungsten oxide, zinc oxide, or nickel oxide, but is not limited thereto.

The hole injection layer and/or the hole transport layer may include, for example, poly(3,4-ethylenedioxythiophene):poly(styrenesulfonate (PEDOT:PSS), poly(9,9-dioctyl-fluorene-co-N-(4-butylphenyl)-diphenylamine) (TFB), polyarylamine, poly(N-vinylcarbazole (PVK), polyaniline, polypyrrole, N,N,N',N'-tetrakis(4-methoxyphenyl)-benzidine (TPD), 4-bis[N-(1-naphthyl)-N-phenyl-amino]biphenyl ($\alpha$-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), p-type metal oxide (e.g., NiO, $WO_3$, or $MoO_3$), a carbon-based material, such as, graphene oxide, or a combination thereof, but is not limited thereto. In an embodiment, the hole injection layer may include TFB, or PVK. The TFB may have a weight average molecular weight of greater than or equal to about 50,000, for example, greater than or equal to about 60,000, greater than or equal to about 70,000, greater than or equal to about 80,000, or greater than or equal to about 90,000. In an embodiment, the hole injection layer may include PEDOT:PSS.

The electron blocking layer (EBL) may include, for example, poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl ($\alpha$-NPD), m-MTDATA, 4,4',4"-tris(N-carbazolyl)-triphenylamine (TCTA), or a combination thereof, but is not limited thereto.

The electron injection layer and/or the electron transport layer may include, for example, 1,4,5,8-naphthalene-tetracarboxylic dianhydride (NTCDA), bathocuproine (BCP), tris [3-(3-pyridyl)-mesityl] borane (3TPYMB), LiF, $Alq_3$, $Gaq_3$, $Inq_3$, $Znq_2$, $Zn(BTZ)_2$, $BeBq_2$, 8-(4-(4,6-di(naphthalen-2-yl)-1,3,5-triazin-2-yl)phenyl)quinolone (ET204), 8-hydroxyquinolinato lithium (Liq), an n-type organic semiconductor for example having a phosphine oxide or an n-type inorganic semiconductor such as n-type metal oxide of a zinc oxide optionally including magnesium (ZnO or ZnMgO), or $HfO_2$), Bphen, or combination thereof, but is not limited thereto.

The hole blocking layer may include, for example, 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto.

In a device according to an embodiment, an anode 10 disposed on a transparent substrate 100 may include a metal oxide-based transparent electrode (e.g., ITO electrode), and a cathode 50 facing the anode may include a metal (Mg, or Al) of a relatively low work function. For example, PEDOT:PSS and/or a p-type metal oxide may be disposed between the transparent electrode 10 and the emission layer 30 as a hole injection layer (or a hole transport layer) 20. An electron auxiliary layer (e.g., an electron transport layer) 40 may be disposed between the quantum dot emission layer 30 and the cathode 50. (see FIG. 1)

A device according to another embodiment has an inverted structure. Herein, a cathode 50 disposed on a transparent substrate 100 may include a metal oxide-based transparent electrode (e.g., ITO), and an anode 10 facing the cathode may include a hole injection metal (e.g., Au, or Ag) (e.g., having a relatively high work function). For example, an n-type metal oxide (ZnO) may be disposed between the transparent electrode 50 and the emission layer 30 as an electron auxiliary layer (e.g., an electron transport layer) 40. $MoO_3$ or another p-type metal oxide may be disposed between the metal anode 10 and the quantum dot emission layer 30 as a hole auxiliary layer (e.g., a hole transport layer) 20. (see FIG. 2)

Hereinafter, specific examples are illustrated. However, these examples are exemplary, and the present disclosure is not limited thereto.

EXAMPLES

Analysis Method

[1] Photoluminescence Analysis

Photoluminescence (PL) spectra of the produced nanocrystals are obtained by using a Hitachi F-7000 spectrometer at an irradiation wavelength of 372 nm.

[2] UV Spectroscopy Analysis

UV spectroscopy analyses are performed by using a Hitachi U-3310 spectrometer to obtain a UV-Visible absorption spectrum.

[3] TEM Analysis (1) Transmission electron microscopic photographs of the nanocrystals are obtained by using an UT F30 Tecnai electron microscope.

(2) A TEM-EDX analysis (elemental mapping) is performed by using an UT F30 Tecnai electron microscope.

[4] ICP Analysis

An inductively coupled plasma-atomic emission spectroscopy (ICP-AES) analysis is performed by using Shimadzu ICPS-8100.

[5] X-ray Diffraction Analysis

An XRD analysis is performed by using Philips XPert PRO equipment with a power of 3 kW to confirm crystal structures of the semiconductor nanocrystals.

[6] Electroluminescence Spectroscopy Analysis

A current depending on a voltage is measured by using a Keithley 2635B source meter, while a voltage is applied thereto, and EL light emitting brightness is measured by using a CS2000 spectrometer.

A synthesis is performed under an inert gas atmosphere (e.g., flowing nitrogen), unless particularly mentioned.

An amount of the precursor is a molar amount, unless particularly mentioned.

Synthesis Example 1-1: Production of InP Core 0.2 millimole (mmol) of indium acetate and 0.6 mmol of palmitic acid are dissolved in 1-octadecene in a 300 milliliters (mL) reaction flask, and the solution is heated up to 120° C. under vacuum. After 1 hour, the atmosphere in the reactor is converted into nitrogen. The reaction solution is heated up to 280° C., a mixed solution of 0.15 mmol of tris(trimethylsilyl)phosphine (TMS3P) and 1 mL of trioctylphosphine is rapidly injected thereinto, and the obtained mixture is reacted for 30 minutes. The reaction solution is rapidly cooled down to room temperature, acetone is added thereto, the obtained mixture is centrifuged to obtain a precipitate, and the precipitate is dispersed in toluene. Subsequently, a UV spectroscopic analysis result of InP semiconductor nanocrystals obtained therefrom shows a UV first absorption maximum wavelength of 580 nm and a core diameter of 3.5 nm.

Synthesis Example 1-2: Red Light-Emitting Semiconductor Nanocrystal Particle Having InP/ZnSeS Core-Shell Structure (Sample No.: R1, R2, R3, R5, R6, R7)

Se powder and S powder are respectively dissolved in TOP to prepare a 2 M Se/TOP stock solution and a 1 M S/TOP stock solution.

Zinc acetate and oleic acid are dissolved in trioctylamine in a 300 mL reaction flask, and the solution is vacuum-treated at 120° C. for 10 minutes. The flask is internally substituted with nitrogen ($N_2$), and is heated up to 180° C.

Subsequently, the InP core according to Synthesis Example 1-1 is added to the solution, a predetermined amount of the Se/TOP stock solution and a predetermined amount of the S/TOP stock solution are added thereto, and the obtained mixture is heated at a predetermined temperature (e.g., 280° C. or 320° C.) and reacted for 60 minutes. Herein, the Se/TOP and S/TPO solutions are three times added.

Each of total Se precursor amounts relative to 1 mol of Indium is 1.2 mol, 5 mol, 9 mol, 16 mol, 8.4 mol, and 8.4 mol, respectively, in Sample Nos. R1, R2, R3, R5, R6, and R7. Each of total S precursor amounts relative to 1 mol of Indium is 9 mol, 15 mol, 24 mol, 24 mol, 20 mol, and 23 mol, respectively, in Sample Nos. R1, R2, R3, R5, and R6. A total amount of Zn precursor relative to 1 mol of Indium is 10 mol, 20 mol, 35 mol, 40 mol, 28 mol, and 30 mol.

When the reaction is complete, the reactor is cooled down, the prepared nanocrystals are centrifuged with ethanol, and then are dispersed in toluene.

Photoluminescence analyses of the obtained nanocrystals (QD) (Sample Nos. R1, R2, and R3) are performed, and the results are shown in Table 1.

A TEM analysis of the nanocrystals (R1, R2, R3, R5, R6, and R7) is performed to measure their size. An ICP analysis of the obtained nanocrystals (R1, R2, and R3) is performed. The results are shown in Table 1, in which PL is Photoluminence, FWHM is Full Width at Half Maximum, and QY is Quantum Yield.

TABLE 1

| Sample | PL (nm) | FWHM (nm) | QY (%) | Atomic ratio | | | | | Size (nm) |
| --- | --- | --- | --- | --- | --- | --- | --- | --- | --- |
| | | | | P | S | Zn | Se | In | |
| R1 | 625 | 40 | 96 | 0.90 | 3.02 | 7.1 | 1.06 | 1.00 | 6.4 |
| R2 | 624 | 41 | 94 | 0.85 | 4.70 | 10.6 | 4.59 | 1.00 | 7.1 |
| R3 | 623 | 39 | 89 | 0.82 | 7.79 | 18.1 | 8.00 | 1.00 | 8.4 |
| R5 | 637 | 34 | 78 | 0.82 | 7.78 | 23.8 | 14.9 | 1.00 | 8.7 |
| R6 | 625 | 42 | 85 | 0.75 | 6.09 | 15.9 | 7.53 | 1.00 | 7.8 |
| R7 | 627 | 36 | 90 | 0.78 | 6.8 | 17.2 | 7.6 | 1.00 | 7.2 |

Synthesis Example 2-1: Production of InZnP Core

An InZnP core is prepared according to the same method as Synthesis Example 1-1, except that the zinc acetate is used in an amount of 0.125 mmol, the reaction time is adjusted into 10 minutes, and the reaction temperature is set at 230° C.

A UV spectroscopic analysis of InZnP semiconductor nanocrystals obtained therefrom is performed, from which the InZnP semiconductor nanocrystals have a UV first absorption maximum wavelength of 510 nm, and a core diameter of 2.5 nm.

Synthesis Example 2-2: Green Light Emitting Semiconductor Nanocrystal Particle Having InP/ZnSeS Core-Shell Structure Each green light emitting semiconductor nanocrystal particle G1, G2, G3, G4, and G5 is synthesized according to the same method as Synthesis Example 2-1, except that each injection amount of Zn, Se, and S is changed.

Each total amount of Se based on 1 mol of In is 16 mol, 17 mol, 17 mol, 17 mol, and 16 mol, respectively, in Sample Nos. G1, G2, G3, G4, and G5

Each total amount of S based on 1 mol is 81 mol, 40 mol, 110 mol, 51 mol, and 45 mol, respectively, in Sample Nos. G1, G2, G3, G4, and G5. Each total amount of Zn based on 1 mol is, respectively, 100 mol, 60 mol, 130 mol, 68 mol, and 65 mol.

Photoluminescence analyses of the obtained nanocrystals (QD) G1, G2, G3, G4, and G5 are performed, and the results are shown in Table 2.

TEM analyses of the obtained nanocrystals G1, G2, G3, G4, and G5 are performed to measure their sizes. ICP analyses of the nanocrystals G1, G2, G3, and G4 are performed. The results are shown in Table 2.

TABLE 2

| Sample | PL (nm) | FWHM (nm) | QY (%) | Atomic ratio | | | | | Size (nm) |
| --- | --- | --- | --- | --- | --- | --- | --- | --- | --- |
| | | | | P | S | Zn | Se | In | |
| G1 | 535 | 36 | 82 | 0.7 | 26.9 | 47.2 | 15.0 | 1.0 | 7.1 |
| G2 | 525 | 38 | 83 | 0.8 | 13.7 | 35.8 | 15.4 | 1.0 | 6.1 |
| G3 | 535 | 35 | 80 | 0.7 | 37.7 | 64.4 | 15.2 | 1.0 | 7.7 |
| G4 | 524 | 36 | 75 | 0.7 | 16.6 | 38.1 | 15.1 | 1.0 | 6.3 |
| G5 | 520 | 50 | 80 | 0.7 | 17.1 | 33.5 | 14.8 | 1.0 | 6.1 |

Synthesis Example 3-1: Production of ZnTeSe Core

Selenium and tellurium are respectively dispersed in trioctylphosphine (TOP) to prepare a 2 M Se/TOP stock solution and a 0.1 M Te/TOP stock solution.

On the other hand, 0.125 mmol of zinc acetate, along with 0.25 mmol of palmitic acid, 0.25 mmol of hexadecylamine, and 10 mL of trioctylamine, is put into a reactor, and is heated up to 120° C. under vacuum. After 1 hour, the atmosphere of the reactor is substituted with nitrogen.

After heating the reactor up to 300° C., the prepared Se/TOP stock solution and Te/TOP stock solution in a Te/Se ratio of 1/25 (for B5 and B6) or 1/30 (for B1 to B4) are rapidly injected thereinto. The reaction time is about 60 minutes. a ZnSeTe core obtained therefrom has a first absorption maximum wavelength in a range of 450 nm to 470 nm, and a maximum peak emission wavelength in a range of 380 nm to 430 nm. The semiconductor nanocrystal has quantum efficiency of about 30% to 40%.

Figure 4:
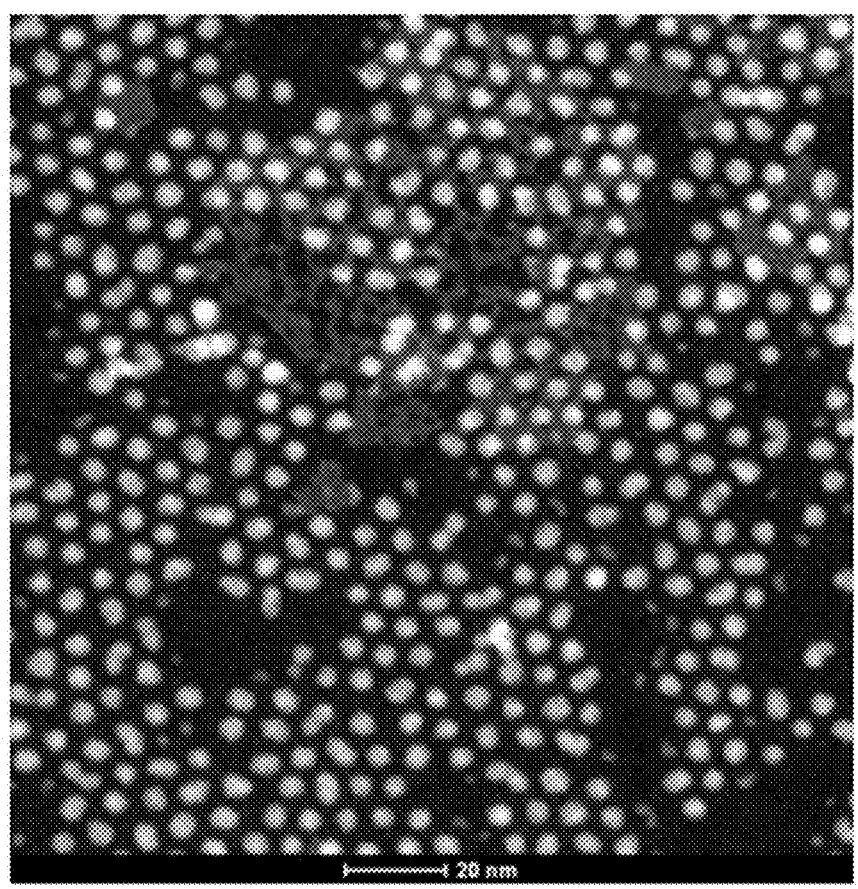
FIG. 4 shows a transmission electron microscopic (TEM) image of ZnTeSe cores produced in Synthesis Example 3-1.

A scanning electron microscope image of the obtained ZnSeTe core is shown in FIG. 4. Referring to the image, the ZnSeTe core turns out to be mostly spherical/polygonal particles having a relatively uniform size distribution.

Synthesis Example 3-2: Synthesis of Blue Semiconductor Nanocrystal Particle of ZnTeSe/ZnSeS/ZnS 1.8 mmoL (0.336 g) of zinc acetate, 3.6 mmol (1.134 g) of oleic acid, and 10 mL of trioctylamine are put in a flask, and are vacuum-treated at 120° C. for 10 minutes. The flask is internally substituted with nitrogen ($N_2$), and is heated up to 180° C. Then, the ZnTeSe core of Example 3-1 is added thereto within 10 seconds, subsequently, a predetermined amount of Se/TOP together with a zinc oleate is slowly injected thereinto, and the obtained mixture is heated up to 280° C. Subsequently, a predetermined amount of S/TOP together with a zinc oleate is added thereto, and the obtained mixture is heated up to 320° C. and reacted for 10 minutes. Consecutively, a mixed solution of a predetermined amount of Se/TOP and a predetermined amount of S/TOP together with a zinc oleate is slowly injected thereinto, and the obtained mixture is reacted again for 20 minutes. Then, Se and S precursors are injected thereinto and reacted for 20 minutes wherein an amount of Se precursor and an amount of S precursor are controlled in light of a desired shell composition. A total amount of the Se precursor as used in the reaction and a total mount of the S precursor as used in the reaction are determined considering a desired composition of the quantum dot and the reactivity of the precursor. For example, the ICP data presented below may represent the amounts of the Se precursor and the S precursor.

Figure 5:
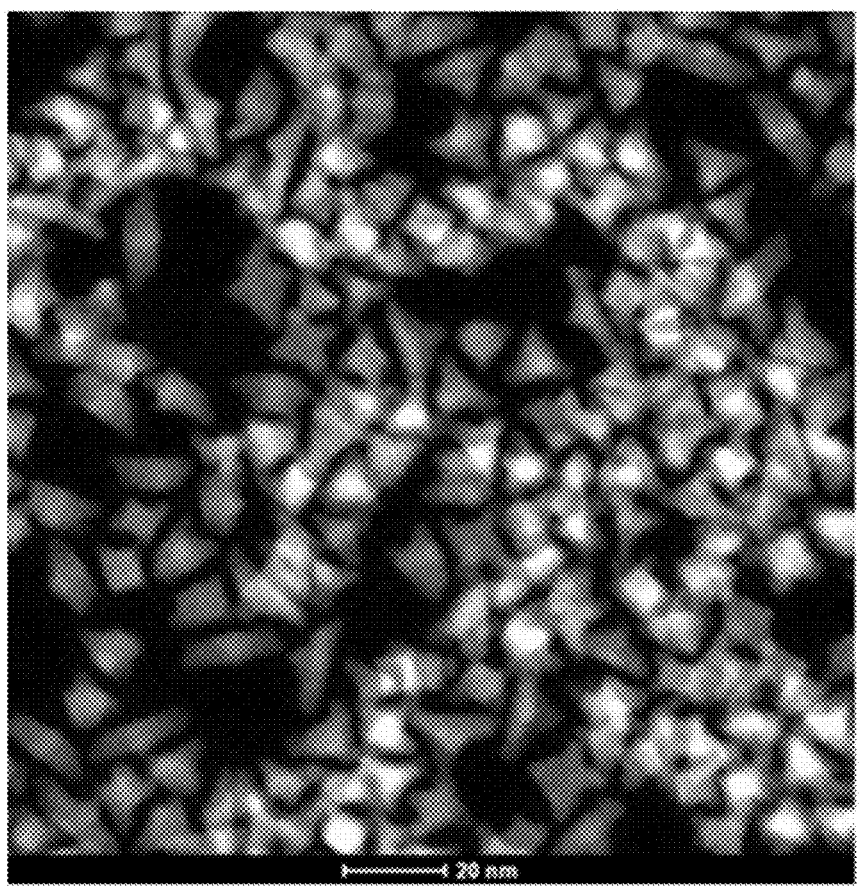
FIG. 5 shows a transmission electron microscopic (TEM) image of the blue light emitting semiconductor nanocrystal particles produced in Synthesis Example 3-2.
Figure 6:
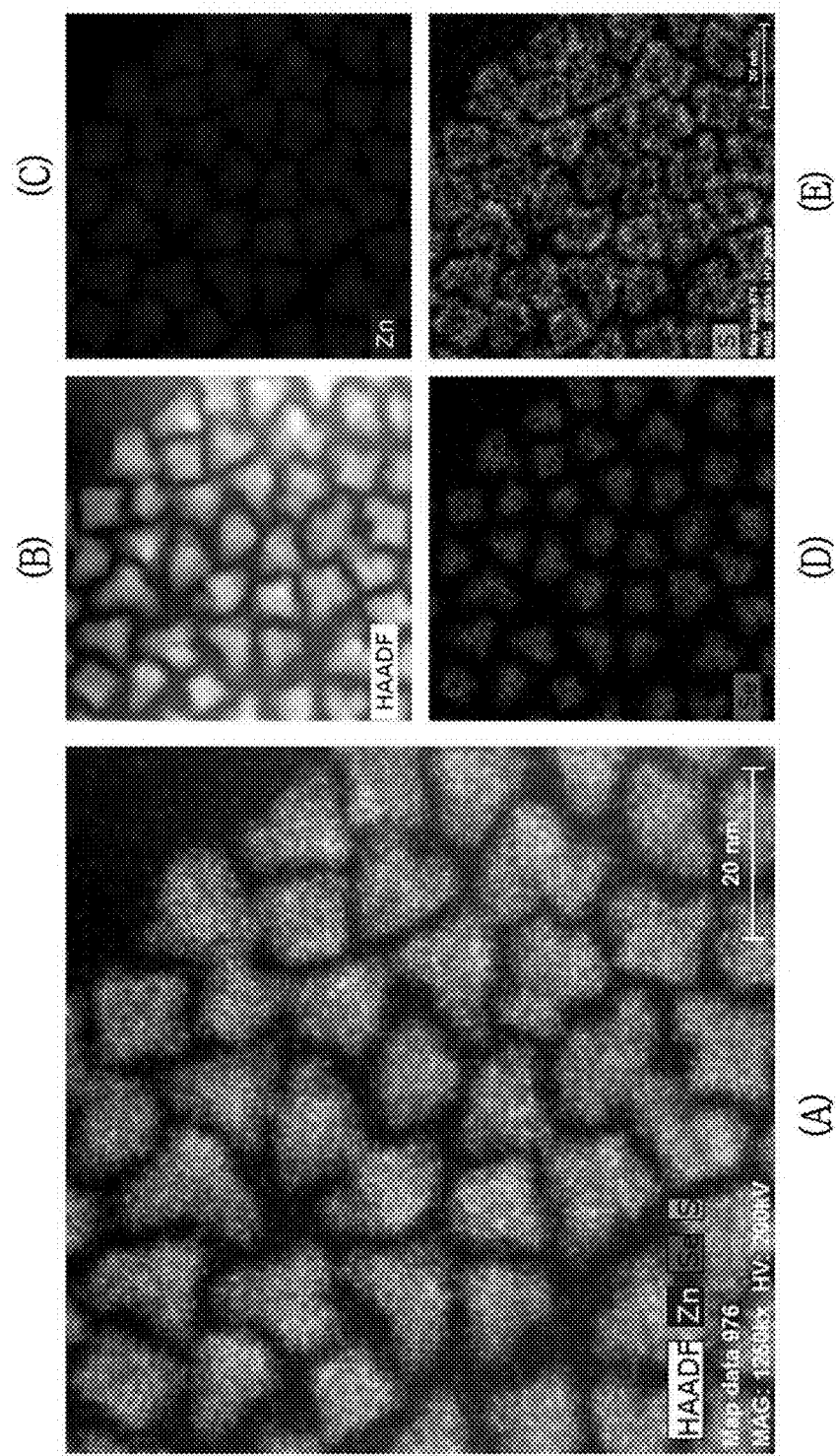
FIGS. 6(A) to (E) show the results of TEM-EDX (element mapping) analysis result of the blue light emitting semiconductor nanocrystal particles produced in Synthesis Example 3-2, in which (A) shows all of the data in single image, (B) is a HAADF image, (C) is a Zn map, (D) is a Se map, and (E) is a S map.

When the reaction is complete, the reactor is cooled down, and the prepared nanocrystals are centrifuged with ethanol and dispersed in toluene. TEM analyses and TEM-EDX mapping analyses of the blue light emitting semiconductor nanocrystals are performed, and the results are shown in FIGS. 5 and 6(A) to €.

Photoluminescence analyses of the blue light emitting semiconductor nanocrystals are performed, and the results are shown in Table 3.

TEM analyses of the blue light emitting semiconductor nanocrystals are performed to measure sizes. ICP analyses of the nanocrystals are performed to measure shell thicknesses. The results are shown in Table 3.

TABLE 3

| Sample | PL (nm) | FWHM (nm) | QY (%) | Atomic ratio | | | Size (nm) |
|---|---|---|---|---|---|---|---|
| | | | | S/Zn | Se/Zn | S/Se | |
| B1 | 446 | 36 | 80 | 0.47 | 0.39 | 1.21 | 8.3 |
| B2 | 450 | 32 | 90 | 0.61 | 0.27 | 1.36 | 9.2 |
| B3 | 449 | 27 | 75 | 0.52 | 0.38 | 1.34 | 9.6 |
| B4 | 449 | 12 | 90 | 0.35 | 0.53 | 0.66 | 9.1 |
| B5 | 460 | 26 | 76 | 0.3 | 0.41 | 0.73 | 10.2 |
| B6 | 461 | 40 | 74 | 0.28 | 0.35 | 0.8 | 9.8 |

Example 1: Electroluminescent Device Emitting Red Light

[1] Each electroluminescent device (ITO/PEDOT:PSS/TFB/QD/ET204:Liq(1:1)/Liq/Al) respectively including the red light emitting semiconductor nanocrystal particles R1, R2, and R3 prepared in Synthesis Example 1-2 in a red QD emission layer is manufactured.

Specifically, an ITO electrode is deposited on a substrate, and a PEDOT:PSS layer and a TFB layer (a TFB molecular weight: 30,000 Daltons) are formed thereon by spin coating. On the TFB layer, octane dispersion of the quantum dots is spin-coated. An organic electron transport layer (ETL, ET204:Liq) is vacuum-deposited thereon, and an Al electrode is deposited thereon.

Electroluminescence properties of the electroluminescent device are measured, while a voltage (0 to 7 V) is applied between the ITO electrode and the Al electrode. The electroluminescence properties are shown in Table 4, in which EQE is External Quantum Efficiency.

TABLE 4

| Sample | EL (nm) | FWHM (nm) | EQE @ 100 nit | Max. Brightness (cd/m$^2$) |
|---|---|---|---|---|
| R1 | 628 | 42 | 1.50 | 248 |
| R2 | 628 | 42 | 2.65 | 316 |
| R3 | 630 | 42 | 2.98 | 1088 |

Referring to Table 4, it is noted that as a shell thickness increases, efficiency and brightness may increase.

Example 2: Electroluminescent Device Emitting Blue Light

Each electroluminescent device (ITO/PE DOT: PSS/TFB (PVK)/QD/ET204:Liq/Al) respectively including the blue light emitting semiconductor nanocrystal particles B1, B2, and B3 according to Synthesis Example 3-2 in a blue QD emission layer is manufactured. The electroluminescence properties are shown in Table 5.

TABLE 5

| Sample | EL (nm) | FWHM (nm) | EQE @ 100 nit | Max. Brightness (cd/m$^2$) |
|---|---|---|---|---|
| B1 | 451 | 43 | 1.96 | 370 |
| B2 | 454 | 37 | 2.47 | 656 |
| B3 | 454 | 33 | 2.65 | 848 |

Referring to the above table, it is noted that as a shell thickness increases, efficiency and brightness may increase.

Figure 7:
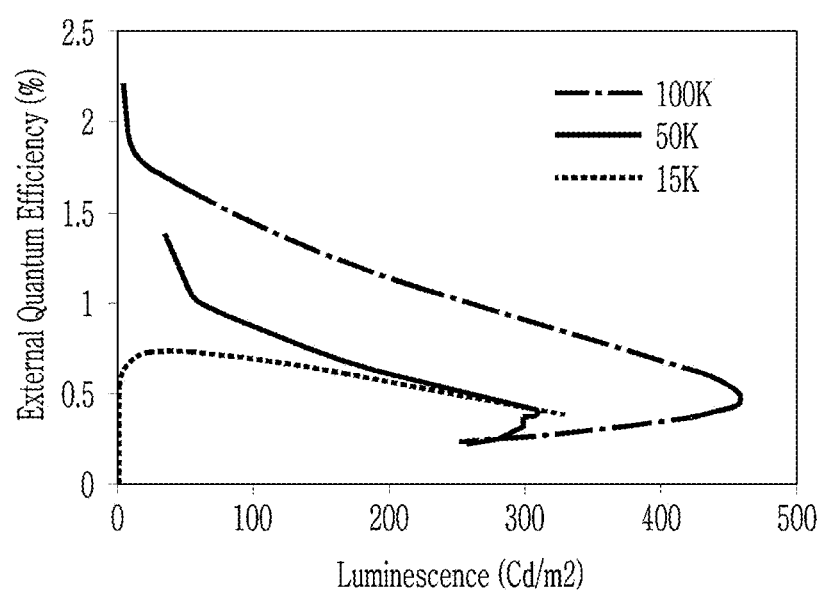
FIG. 7 is a graph of external quantum efficiency (percent, %) versus luminescence (candelas per square meter, $cd/m^2$) and shows changes of EL properties of the device depending on molecular weights of polymer (TFB) for a hole auxiliary layer in Example 2.

[2] An electroluminescent device is manufactured using the quantum dot of B3 according to the same method as the above [1], except that the weight average molecular weight of TFB is changed into 15,000, 50,000, and 100,000, respectively, and then, EQE thereof is measured. The results are shown in FIG. 7. Referring to the results of FIG. 7, TFB having a weight average molecular weight of greater than or equal to 50,000 shows improved maximum EQE.

Figure 8:
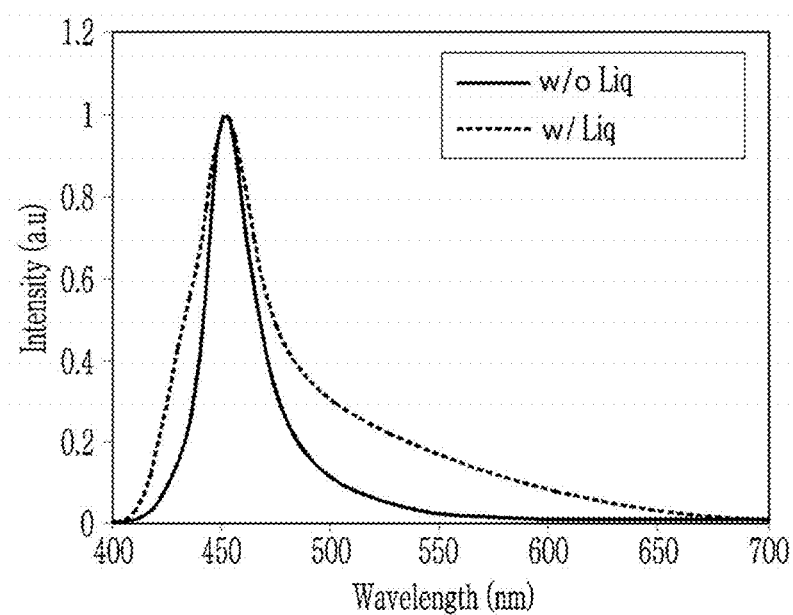
FIG. 8 is a graph of intensity (arbitrary units) versus wavelength (nanometers, nm) and shows EL spectra of the devices using an organic n-type semiconductor with Liq or without Liq as a material of an electron auxiliary layer in Example 3, respectively.

[3] An electroluminescent device is manufactured according to the same method as the above [1], except that n-type organic semiconductor materials having a phosphine oxide group with Liq (w/Liq) or without Liq (w/o Liq) is are used to form EIL and ETL, respectively, and the EQE thereof is measured. The results are shown in FIG. 8. Referring to the result of FIG. 8, an EL emission full width at half maximum (FWHM) is changed depending on ETL, and in the case of Liq, a full width at half maximum (FWHM) increases.

Electroluminescent Display Device including Red/Green/Blue Pixels

Example 3

A PEDOT:PSS layer and TFB (or PVK) layer are formed as a hole auxiliary layer through spin-coating on a glass substrate deposited with an ITO electrode (an anode). On the TFB (or PVK) layer, a quantum dot emission layer is formed by spin-coating octane dispersion of quantum dots. Herein, the red light emitting quantum dots R1 according to Synthesis Example 1-2, the green light emitting quantum dots G1 according to Synthesis Example 2-2, and the blue light emitting quantum dots B2 according to Synthesis Example 3-2 are used. On the quantum dot emission layer, an ET204:Liq layer is formed as the electron auxiliary layer, and then, an Al electrode is deposited thereon.

Electroluminescence properties of a RGB electroluminescent display device manufactured therefrom are measured, while a voltage (0 to 7 V) is applied between the ITO electrode and the Al electrode. The electroluminescence properties of the RGB electroluminescent display device are shown in Table 6.

TABLE 6

| Quantum | EL spectrum | | CIE 1931 coordinate | |
|---|---|---|---|---|
| dot | Peak (nm) | FWHM (nm) | Cx | Cy |
| R1 | 628 | 42 | 0.669 | 0.328 |
| G1 | 536 | 39 | 0.273 | 0.691 |
| B3 | 454 | 33 | 0.149 | 0.093 |

Referring to the above result, the RGB electroluminescent display device shows color reproducibility of 91.1% according to a DCI standard.

Figure 9:
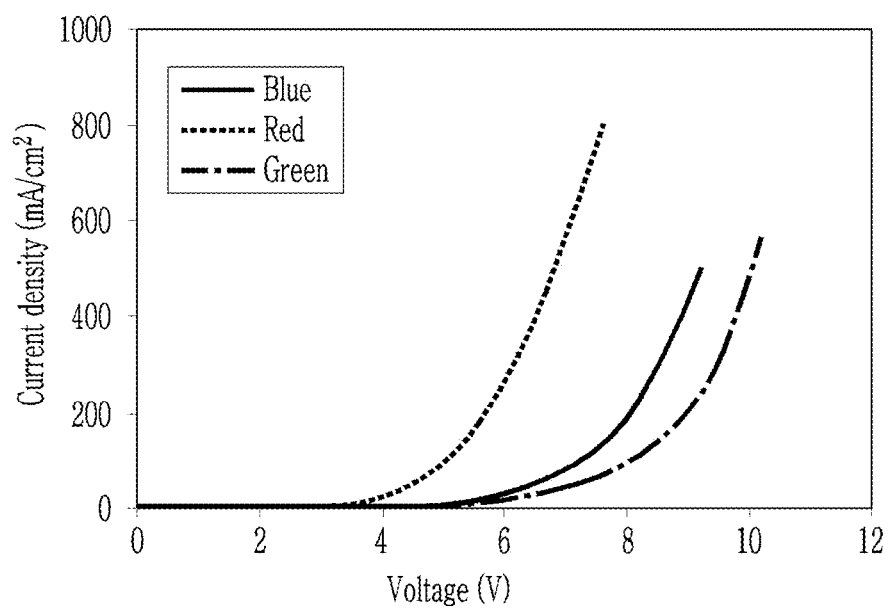
FIG. 9 is a graph of current density (milliamperes per square centimeter, $mA/cm^2$) versus voltage (V) and shows changes of current depending on a voltage of the device of Example 4.
Figure 10:
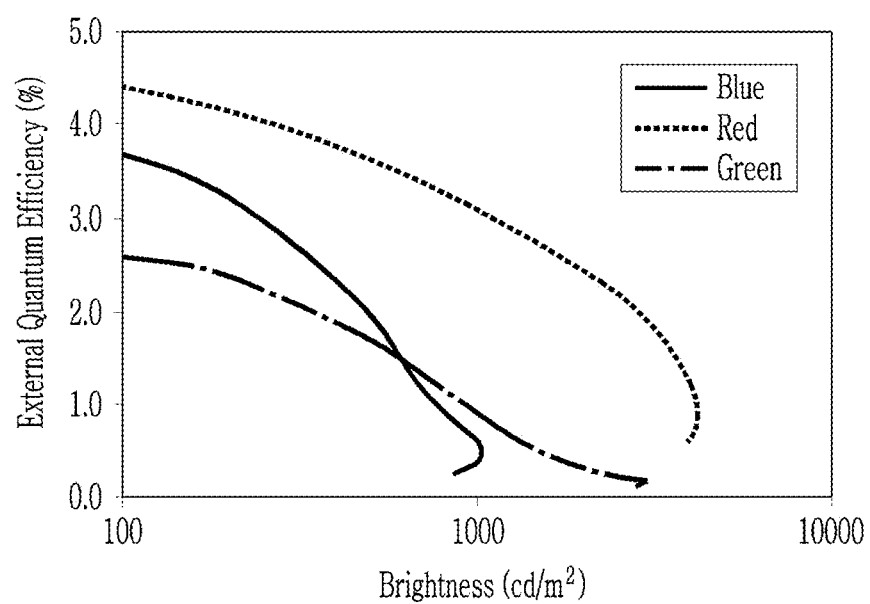
FIG. 10 is a graph external quantum efficiency (%) versus brightness (candelas per square meter ($cd/m^2$) and shows external quantum efficiency depending on brightness of the device of Example 4.

Electroluminescence properties (IN and EQE change) of the device are measured depending on a voltage applied thereto, and the results are shown in FIGS. 9 and 10.

Accordingly, the RGB electroluminescent display device shows improved electroluminescence properties.

Example 4

An RGB electroluminescent display device is manufactured according to the same method as Example 3, except that the quantum dots are respectively used as shown in the following table, and electroluminescence properties thereof are measured. The results are shown in Table 7.

TABLE 7

| Quantum | EL spectrum | | CIE 1931 coordinate | |
|---|---|---|---|---|
| dot | Peak (nm) | FWHM (nm) | Cx | Cy |
| R1 | 628 | 42 | 0.669 | 0.328 |
| G2 | 527 | 39 | 0.221 | 0.709 |
| B2 | 454 | 33 | 0.149 | 0.093 |

The RGB electroluminescent display device shows a color reproducibility of 89.2% according to a DCI standard, and 71.5% of color reproducibility according to BT2020.

Example 5

PEDOT:PSS layer and TFB (or PVK) layer are spin-coated to form a hole auxiliary layer on a glass substrate deposited with an ITO electrode (an anode). On the TFB (or PVK) layer, a quantum dot emission layer is formed by spin-coating octane dispersion of quantum dots. Herein, R5 of Synthesis Example 1-2 as a red light emitting quantum dot, G3 of Synthesis Example 2-2 as a green light emitting quantum dot, and B4 of Synthesis Example 3-2 as a blue light emitting quantum dot are used. On the quantum dot emission layer, ET204:Liq is formed as the electron auxiliary layer, and an Al electrode is deposited thereon.

Electroluminescence properties of a display device manufactured therefrom are measured by applying a voltage (0 to 7 V) between the ITO electrode and the Al electrode. The electroluminescence properties of the device are shown in Table 8.

TABLE 8

| Quantum | EL spectrum | | CIE 1931 coordinate | |
|---|---|---|---|---|
| dot | Peak (nm) | FWHM (nm) | Cx | Cy |
| R5 | 627 | 36 | 0.684 | 0.315 |
| G3 | 536 | 37 | 0.264 | 0.70 |
| B4 | 454 | 19 | 0.149 | 0.057 |

Referring to the result of Table 8, the RGB electroluminescent display device shows a color reproducibility of 100% according to a DCI standard, and color reproducibility of 74.2% according to BT2020.

Example 6

A display device is manufactured according to the same method as Example 3, except that G4 of Synthesis Example 2-2 is used as the green light emitting quantum dot, and electroluminescence properties thereof are measured. The results are summarized in Table 9.

TABLE 9

| Quantum | EL spectrum | | CIE 1931 coordinate | |
|---|---|---|---|---|
| dot | Peak (nm) | FWHM (nm) | Cx | Cy |
| R5 | 640 | 36 | 0.703 | 0.296 |
| G4 | 525 | 37 | 0.199 | 0.717 |
| B4 | 454 | 19 | 0.149 | 0.057 |

Referring to the result of Table 9, the RGB electroluminescent display device shows a color reproducibility of 96% according to a DCI standard, and color reproducibility of 83.5% according to BT2020.

Comparative Example 1

A display device is manufactured according to the same method as Example 3, except that R5, G5, and B4 are respectively used as the red, green, and blue light emitting quantum dots, and electroluminescence properties thereof are measured. The results are shown in the following table. The display device has a color reproducibility of less than 89% (about 87%) according to a DCI standard.

Comparative Example 2

A display device is manufactured according to the same method as Example 3, except that R6, G4, and B5 are respectively used as the red, green, and blue light emitting quantum dots, and electroluminescence properties thereof are measured. The results are shown in the following table. The display device has a color reproducibility of less than 89% (about 83%) according to a DCI standard.

Comparative Example 3

A display device is manufactured according to the same method as Example 3, except that R7, G4, and B6 are respectively used as the red, green, and blue light emitting quantum dots, and electroluminescence properties thereof are measured. The results are shown in the following table. The display device has a color reproducibility of less than 89% (about 88%) according to a DCI standard. The results are summarized in Table 10.

TABLE 10

| | Quantum Dot | EL spectrum Peak (nm) | EL spectrum FWHM (nm) | CIE 1931 coordinate Cx | CIE 1931 coordinate Cy |
|---|---|---|---|---|---|
| Comparative Example 1 | R5 | 640 | 36 | 0.703 | 0.296 |
| | G5 | 520 | 50 | 0.268 | 0.624 |
| | B4 | 454 | 19 | 0.149 | 0.057 |
| Comparative Example 2 | R6 | 625 | 42 | 0.663 | 0.333 |
| | G4 | 525 | 37 | 0.199 | 0.717 |
| | B5 | 460 | 26 | 0.143 | 0.111 |
| Comparative Example 3 | R7 | 627 | 36 | 0.684 | 0.315 |
| | G4 | 525 | 37 | 0.199 | 0.717 |
| | B6 | 461 | 40 | 0.135 | 0.107 |

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A electroluminescent display device, comprising:
    a first electrode and a second electrode facing each other; and
    a quantum dot emission layer disposed between the first electrode and the second electrode, the quantum dot emission layer comprising a plurality of quantum dots and not comprising cadmium,
    wherein the quantum dot emission layer comprises a red emission layer disposed in a red pixel, a green emission layer disposed in a green pixel, and a blue emission layer disposed in a blue pixel,
    wherein the red emission layer comprises a plurality of red light emitting quantum dots, and the red pixel exhibits an electroluminescence peak wavelength in a range of about 627 nanometers to about 640 nanometers and a full width at half maximum of less than or equal to about 42 nanometers,
    wherein the green emission layer comprises a plurality of green light emitting quantum dots, and the green pixel exhibits a electroluminescence peak wavelength in a range of about 525 nanometers to about 536 nanometers and a full width at half maximum of less than or equal to about 39 nanometers,
    wherein the blue emission layer comprises a plurality of blue light emitting quantum dots, and the blue pixel exhibits a electroluminescence peak wavelength in a range of about 440 nanometers to about 460 nanometers and a full width at half maximum of less than or equal to about 33 nanometers, and
    wherein the device has a color reproducibility according to a DCI standard of greater than or equal to about 89 percent.

2. The electroluminescent display device of claim 1, wherein the device has a color reproducibility according to a BT2020 standard of greater than or equal to about 66 percent.

3. The electroluminescent display device of claim 1, wherein the device has a color reproducibility according to a DCI standard of greater than or equal to about 94 percent.

4. The electroluminescent display device of claim 1, wherein the device has a color reproducibility according to a BT2020 standard of greater than or equal to about 72 percent.

5. The electroluminescent display device of claim 1, wherein the red pixel exhibits a full width at half maximum of less than or equal to 36 nm,
    the green pixel exhibits a full width at half maximum of less than or equal to 37 nanometers, and
    the blue pixel exhibits a full width at half maximum of less than or equal to 30 nanometers.

6. The electroluminescent display device of claim 1, wherein the red light emitting quantum dots comprise a semiconductor nanocrystal particle comprising a core comprising indium, phosphorus, and optionally zinc, and a shell disposed on a surface of the core, the shell comprising zinc, sulfur, and optionally selenium.

7. The electroluminescent display device of claim 6, wherein the semiconductor nanocrystal particle has a size of greater than or equal to about 5 nanometers and less than or equal to about 15 nanometers.

8. The electroluminescent display device of claim 1, wherein the green light emitting quantum dots comprise a green light emitting semiconductor nanocrystal particle comprising a core comprising indium, phosphorus, and optionally zinc, and a shell disposed on a surface of the core and comprising zinc, sulfur, and optionally selenium.

9. The electroluminescent display device of claim 8, wherein the green light emitting semiconductor nanocrystal particle has a size of greater than or equal to about 6 nanometers and less than or equal to about 15 nanometers.

10. The electroluminescent display device of claim 1, wherein the blue light emitting quantum dots comprise a blue light emitting semiconductor nanocrystal particle comprising zinc, tellurium, and selenium,
    wherein an amount of the tellurium is less than an amount of the selenium, and
    the blue light emitting semiconductor nanocrystal particle has a core comprising a first semiconductor material comprising zinc, tellurium, and selenium, and a shell disposed on at least a portion of the core, the shell comprising a second semiconductor material having a composition different from a composition of the first semiconductor material.

11. The electroluminescent display device of claim 10, wherein in the blue light emitting semiconductor nanocrystal particle, a mole ratio of the tellurium relative to the selenium is less than or equal to about 0.05.

12. The electroluminescent display device of claim 10, wherein in the semiconductor nanocrystal particle, an amount of the zinc is greater than an amount of the selenium.

13. The electroluminescent display device of claim 10, wherein in the semiconductor nanocrystal particle, a mole ratio of the tellurium relative to the zinc is less than or equal to about 0.03.

14. The electroluminescent display device of claim 10, wherein the first semiconductor material comprises $ZnTe_xSe_{1-x}$, wherein, x is greater than about 0 and less than or equal to about 0.05.

15. The electroluminescent display device of claim 10, wherein the second semiconductor material comprises zinc, selenium, and sulfur.

16. The electroluminescent display device of claim 10, wherein the blue light emitting semiconductor nanocrystal particle has a size of greater than or equal to about 8 nanometers and less than or equal to about 30 nanometers.

17. The electroluminescent display device of claim 1, wherein in the device, the red pixel has peak external quantum efficiency of greater than or equal to about 2 percent.

18. The electroluminescent display device of claim 1, wherein in the device, the green pixel has peak external quantum efficiency of greater than or equal to about 2 percent.

19. The electroluminescent display device of claim 1, wherein in the device, the blue pixel has peak external quantum efficiency of greater than or equal to about 2 percent.

20. The electroluminescent display device of claim 1, wherein in the device, the red pixel has maximum brightness of greater than or equal to about 200 candelas per square meter.

21. The electroluminescent display device of claim 1, wherein in the device, the green pixel has maximum brightness of greater than or equal to about 300 candelas per square meter.

22. The electroluminescent display device of claim 1, wherein in the device, the blue pixel has maximum brightness of greater than or equal to about 300 candelas per square meter.

23. The electroluminescent display device of claim 1, wherein the device comprises a charge auxiliary layer, and wherein the charge auxiliary layer is between the first electrode and the quantum dot emission layer, between the second electrode and the quantum dot emission layer, or a combination thereof.

24. The electroluminescent display device of claim 23, wherein
the first electrode is an anode, and
the electroluminescent display device comprises a hole injection layer, a hole transport layer, an electron blocking layer, or a combination thereof between the first electrode and the quantum dot emission layer, and
the second electrode is a cathode, and
the electroluminescent display device comprises an electron injection layer, an electron transport layer, a hole blocking layer, or a combination thereof between the second electrode and the quantum dot emission layer.

25. The electroluminescent display device of claim 24, wherein the hole transport layer comprises poly[9,9-dioctylfluorene-co-N-[4-(3-methylpropyl)]di-phenylamine], and the poly[9,9-dioctylfluorene-co-N-[4-(3-methylpropyl)]di-phenylamine] has a weight average molecular weight of greater than or equal to about 50,000 Daltons.

26. The electroluminescent display device of claim 24, wherein at least one of the electron transport layer and the electron injection layer comprises 8-(4-(4,6-di(naphthalen-2-yl)-1,3,5-triazin-2-yl)phenyl)quinolone: 8-hydroxyquinolinato lithium, 8-hydroxyquinolinato lithium, a zinc oxide, or a combination thereof.

27. The electroluminescent display device of claim 23, wherein the charge auxiliary layer does not comprise poly-[(9,9-bis(3'-(N,N-dimethylamino)propyl)-2,7-fluorene)-alt-2,7-(9,9-dioctylfluorene)].

28. The electroluminescent display device of claim 27, wherein the charge auxiliary layer does not comprise a conjugated polyelectrolyte.

* * * * *